(12) United States Patent
Yip

(10) Patent No.: US 11,329,030 B2
(45) Date of Patent: May 10, 2022

(54) PRODUCTION OF A CHIP MODULE

(71) Applicant: OSRAM Opto Semiconductors GmbH, Regensburg (DE)

(72) Inventor: Heng Keong Yip, Shah Alam (MY)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 16/607,223

(22) PCT Filed: May 2, 2017

(86) PCT No.: PCT/EP2017/060411
§ 371 (c)(1),
(2) Date: Oct. 22, 2019

(87) PCT Pub. No.: WO2018/202280
PCT Pub. Date: Nov. 8, 2018

(65) Prior Publication Data
US 2020/0083200 A1 Mar. 12, 2020

(51) Int. Cl.
| | |
|---|---|
| H01L 25/075 | (2006.01) |
| H01L 33/48 | (2010.01) |
| H01L 33/60 | (2010.01) |
| H01L 33/62 | (2010.01) |
| H01L 23/498 | (2006.01) |
| H01L 23/00 | (2006.01) |
| H01L 21/00 | (2006.01) |

(52) U.S. Cl.
CPC .......... *H01L 25/0753* (2013.01); *H01L 21/00* (2013.01); *H01L 23/498* (2013.01); *H01L 24/97* (2013.01); *H01L 33/486* (2013.01); *H01L 33/60* (2013.01); *H01L 33/62* (2013.01); *H01L 2933/0058* (2013.01); *H01L 2933/0066* (2013.01)

(58) Field of Classification Search
CPC ..... H01L 21/00; H01L 23/495; H01L 23/498; H01L 24/97; H01L 24/00; H01L 24/01; H01L 24/49; H01L 25/0753; H01L 33/486; H01L 33/60; H01L 33/62; H01L 2933/0058; H01L 2933/0066; H01L 2933/0033
See application file for complete search history.

(56) References Cited

U.S. PATENT DOCUMENTS

| | | | |
|---|---|---|---|
| 2005/0056916 A1 | 3/2005 | Sakamoto et al. | |
| 2007/0221928 A1* | 9/2007 | Lee | H01L 33/486 |
| | | | 257/79 |

(Continued)

FOREIGN PATENT DOCUMENTS

| | | | | |
|---|---|---|---|---|
| DE | 2020100008806 | * 12/2020 | | H01L 33/56 |
| JP | 2010274042 | * 12/2012 | | |
| WO | 2016/021476 A1 | 2/2016 | | |

*Primary Examiner* — Galina G Yushina
(74) *Attorney, Agent, or Firm* — DLA Piper LLP (US)

(57) ABSTRACT

A method of producing a chip module includes providing a carrier; arranging semiconductor chips on the carrier; applying an electrically insulating material on the carrier; and structuring the carrier such that the chip module is provided, wherein the chip module includes separate carrier sections produced by structuring the carrier, the carrier sections of the chip module connected by the electrically insulating material.

14 Claims, 26 Drawing Sheets

(56) References Cited

U.S. PATENT DOCUMENTS

| | | | |
|---|---|---|---|
| 2008/0044934 A1* | 2/2008 | Loh | H01L 24/97 |
| | | | 438/21 |
| 2009/0212316 A1 | 8/2009 | Braune et al. | |
| 2010/0067216 A1* | 3/2010 | Li | F21V 3/12 |
| | | | 362/84 |
| 2010/0229868 A1* | 9/2010 | Rummery | A61M 16/0622 |
| | | | 128/205.25 |
| 2011/0186875 A1 | 8/2011 | Egoshi et al. | |
| 2012/0025361 A1* | 2/2012 | Ito | H01L 23/047 |
| | | | 257/676 |
| 2013/0200400 A1* | 8/2013 | Jang | H01L 25/0753 |
| | | | 257/88 |
| 2014/0004634 A1* | 1/2014 | Sakai | H01L 33/486 |
| | | | 438/27 |
| 2016/0014878 A1* | 1/2016 | Kilhenny | H05K 3/0094 |
| | | | 257/99 |
| 2016/0215955 A1* | 7/2016 | Donato | F21V 5/007 |
| 2016/0246049 A1* | 8/2016 | Sakai | G02B 23/2423 |
| 2016/0380172 A1 | 12/2016 | Brandl et al. | |
| 2017/0062382 A1* | 3/2017 | Brandl | H01L 33/0095 |
| 2017/0077361 A1 | 3/2017 | Brandl et al. | |
| 2018/0175267 A1 | 6/2018 | Hirasawa et al. | |

\* cited by examiner

PRODUCTION OF A CHIP MODULE

TECHNICAL FIELD

This disclosure relates to a method of producing a chip module and a chip module.

BACKGROUND

For displaying images, videos and information in outdoor and indoor areas, the application of LED (Light Emitting Diode) video walls is becoming more and more common. An LED video wall may comprise a plurality of LED modules arranged next to one another. An LED module, also referred to as LED tile, may comprise a printed circuit board on which a plurality of discrete LED components may be arranged. The LED components may be packaged SMT (Surface Mounting Technology) components comprising one or several LED chips.

There is nonetheless a need for an improved chip module and an improved method of producing a chip module.

SUMMARY

I provide a method of producing a chip module including providing a carrier; arranging semiconductor chips on the carrier; applying an electrically insulating material on the carrier; and structuring the carrier such that the chip module is provided, wherein the chip module includes separate carrier sections produced by structuring the carrier, the carrier sections of the chip module connected by the electrically insulating material.

I also provide a chip module including separate carrier sections connected by an electrically insulating material and semiconductor chips arranged on at least a part of the carrier sections.

Figure 1:
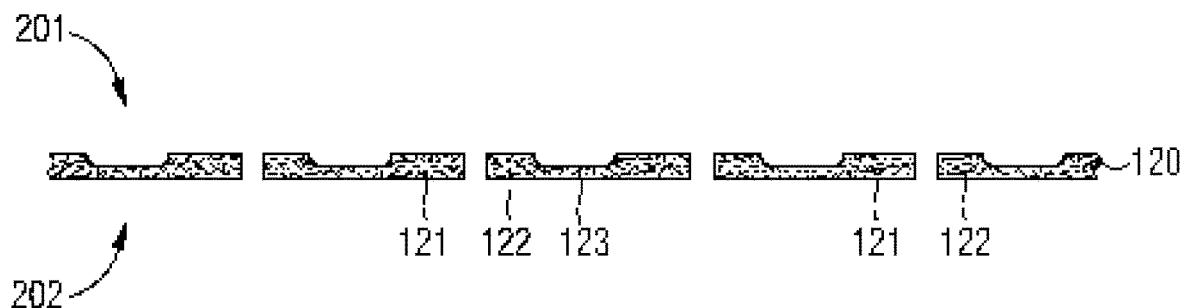
FIGS. 1 to 5 show a possible method sequence of producing a chip module on the basis of lateral illustrations, including providing a leadframe-based carrier, wherein the leadframe-based carrier includes molded bodies with a cavity, arranging radiation-emitting semiconductor chips on the carrier in the cavities of the molded bodies, filling the cavities of the molded bodies with an encapsulation material, applying an electrically insulating material on the carrier in areas laterally to and between the molded bodies, and carrying out a structuring process such that the chip module is provided, wherein the chip module includes separate carrier sections produced by the structuring and connected by the electrically insulating material.

LIST OF REFERENCE SIGNS 100 chip module
110 carrier
111 carrier
112 carrier
113 carrier
114 carrier
120 leadframe
121 leadframe section
122 leadframe section
123 connection structure
130 molding compound
131 molded body
132 cavity
140 semiconductor chip
141 semiconductor chip
142 semiconductor chip
143 semiconductor chip
149 bond wire
150 encapsulation material
160 electrically insulating material
161 lens
170 carrier material
171 conductor structure
172 conductor structure
200 chip component
201 front side
202 back side
210 carrier section
221 leadframe section
222 leadframe section 223 leadframe section
250 separating line
251 transection
255 trench

DETAILED DESCRIPTION

My method may comprise providing a carrier, arranging semiconductor chips on the carrier, applying an electrically insulating material on the carrier, and structuring the carrier such that the chip module is provided. The chip module may comprise separate carrier sections produced by the structuring of the carrier. The carrier sections of the chip module may be connected by the electrically insulating material.

Instead of arranging packaged components or, respectively, discrete packages with one or several semiconductor chips on a carrier, the method involves arranging semiconductor chips, that is to say unpackaged dies, on the carrier. As a result, it is possible to produce the chip module such that the semiconductor chips are arranged in close proximity to each other.

By structuring the carrier, the carrier is divided into discrete carrier sections. Consequently, respective chip components may be produced, each chip component comprising at least one carrier section. In the chip module provided in this manner, the carrier sections are no longer connected by material of the initial carrier. Instead, the carrier sections and thus the chip components are connected and therefore held together by the electrically insulating material applied on the carrier before the structuring step. In this way, the carrier sections and the chip components may be electrically isolated from each other. This configuration allows for an independent current feed and operation of the chip components.

In the following, further possible details and examples of the method and of the chip module manufactured by the method are specified.

The chip module produced in accordance with the method may be a QFN module or, respectively, QFN panel (Quad Flat No Leads) suitable for surface mounting (SMT, Surface-Mounting Technology).

The steps of the production method may be carried in the order indicated above. Consequently, the carrier may be provided, subsequently the semiconductor chips may be arranged on the carrier, subsequently the electrically insulating material may be applied on the carrier and, after this, the carrier may be structured.

The carrier may at least partly comprise an electrically conductive or, respectively, metallic material. Moreover, the carrier may comprise two opposite main sides, that is to say a front side and a back side. Arranging the semiconductor chips and applying the electrically insulating material may be carried out on the front side of the carrier. Structuring the carrier may be carried out at or, respectively, from the back side of the carrier. The carrier sections provided by the structuring of the carrier or, respectively, a part of the carrier sections may each carry at least one semiconductor chip. In a similar way, the chip components provided by the structuring of the carrier may each comprise at least one semiconductor chip.

Structuring the carrier may comprise severing or, respectively, removing a part of the carrier. Moreover, structuring the carrier may be carried out by a mechanical process. As an example, a sawing or cutting process may be carried out. Another possible process is laser cutting. It is possible not only to sever the carrier in the structuring step, but also to severe or, respectively, remove a part of the electrically insulating material. Furthermore, recesses or, respectively, trenches may be formed in the structuring step. The recesses or trenches may be produced in the form of a continuous grid structure, and may be present at a back side of the provided chip module.

In the context of arranging the semiconductor chips on the carrier, electrical connections between the semiconductor chips and the carrier may furthermore be produced. In this respect, mounting the semiconductor chips on the carrier and establishing electrical connections may comprise carrying out processes such as soldering, gluing and/or wire bonding.

The chip module produced by the method may be configured to generate electromagnetic radiation. In this regard, provision may be made for the semiconductor chips arranged on the carrier to be radiation-emitting semiconductor chips. The semiconductor chips may, for example, be light emitting diode chips (LED chips) configured to emit light radiation.

With regard to the above-mentioned example, the chip module may, for example, be used as a solid state light source in general lighting applications or as a display module for a video wall. Another application example is IR (Infrared) illumination, for example, for CCTV (Closed Circuit Television). Depending on the application, the chip module may be produced with an appropriate configuration and design, and appropriate radiation-emitting semiconductor chips may be arranged on the carrier. In this context, arranging the semiconductor chips close to each other as described above makes it, for example, possible to provide a high video resolution within a small area or a homogeneous illumination over a wide area.

Semiconductor chips configured to generate a first light radiation, semiconductor chips configured to generate a second light radiation and semiconductor chips configured to generate a third light radiation may be arranged on the carrier. This example may be considered for when the chip module is a display module for a video wall. In this regard, the first, second and third light radiation may be a red, green and blue light radiation (RBG). Moreover, structuring the carrier may be carried out such that on each carrier section of the provided chip module a semiconductor chip that generates the first light radiation, a semiconductor chip that generates the second light radiation and a semiconductor chip that generates the third light radiation are arranged. In a similar way, the chip components provided by the structuring of the carrier may each comprise a semiconductor chip that generates the first light radiation, a semiconductor chip that generates the second light radiation and a semiconductor chip that generates the third light radiation.

The electrically insulating material may be a flexible material. By way of example, a silicone material may be used. In this way, the chip module manufactured by the method and comprising carrier sections and chip components connected by the electrically insulating material may comprise a flexible construction. This configuration makes it possible to mount the chip module, for example, on a curved surface.

Alternatively, other materials may be considered with regard to the electrically insulating material. An example is an epoxy material. In this way, the chip module manufactured by the method may be rigid.

Applying the electrically insulating material on the carrier may be carried out by processes such as filling, potting or molding.

With respect to the provided carrier, different examples may be considered. In one example, the carrier comprises an electrically insulating carrier material and electrical conductor structures. In the step of arranging semiconductor chips on the carrier, the semiconductor chips may be mounted on and electrically connected to electrical conductor structures of the carrier.

With regard to the above-mentioned configuration of the carrier, the following example may be considered. In this example, the carrier is a leadframe-based carrier comprising a metallic leadframe and a molding compound connected to the metallic leadframe. The metallic leadframe may comprise metallic leadframe sections and metallic connection structures connecting the leadframe sections. The connection structures may comprise a web-type shape. Providing the metallic leadframe may comprise structuring an initial metallic layer, for example, by etching. Afterwards, a molding process may be carried out in which the molding compound may be molded around the metallic leadframe. The molding compound may be an electrically insulating plastic material such as PC (Polycarbonate) or PPA (Polyphthalamide).

With regard to application of a leadframe-based carrier, semiconductor chips may be arranged on a part of the leadframe sections of the leadframe. Another part of the leadframe sections may be used for connecting bond wires.

Moreover, structuring the leadframe-based carrier may be carried out such that connection structures of the metallic leadframe may be severed. In this way, connections of the leadframe sections realized by the connection structures may be interrupted. The carrier sections produced by the structuring of the leadframe-based carrier may each comprise, apart from the molding compound, several separate leadframe sections. On each of the carrier sections, at least one semiconductor chip may be arranged.

The leadframe-based carrier may comprise molded bodies formed from the molding compound, each molded body enclosing a cavity. In the step of arranging the semiconductor chips on the carrier, the semiconductor chips may be arranged on the metallic leadframe, that is to say on leadframe sections of the same, in the cavities of the molded bodies. Moreover, the electrically insulating material may be applied on the carrier in areas laterally to and between the molded bodies.

The molded bodies may be connected to each other by the molding compound, and may comprise a frame-type shape. The cavities of the molded bodies may comprise a widening cross-sectional shape in a direction away from the leadframe. In this way, the molded bodies may act as reflectors.

Moreover, structuring the leadframe-based carrier with the molded bodies may be carried out such that the carrier sections produced by the structuring may each comprise a molded body enclosing a cavity within which at least one semiconductor chip may be arranged.

The cavities of the molded bodies may be filled with an encapsulation material. In this way, the semiconductor chips arranged within the cavities may be encapsulated and therefore protected against external influences. The encapsulation material may, for example, be a clear and light-transmissive material such as a silicone material.

The encapsulation material may be used not only for encapsulation purposes, but also for radiation conversion. In such an example, the encapsulation material may comprise a basic material such as a silicone material and phosphor particles embedded therein. In this way, the encapsulation material may at least partly convert a light radiation generated by the radiation-emitting semiconductor chips during operation.

The leadframe-based carrier may comprise a planar shape with a planar front side and a planar back side. In this configuration, the front side and the back side may be constituted of the metallic leadframe and the molding compound.

With regard to a carrier comprising an electrically insulating carrier material and electrical conductor structures, the following configurations may also be considered.

The carrier may be a printed circuit board. The printed circuit board may comprise an electrically insulating basic material such as FR4 and electrical or, respectively, metallic conductor structures.

The carrier may be a ceramic carrier comprising electrical or, respectively, metallic conductor structures.

With regard to application of a printed circuit board or a ceramic carrier, the carrier may comprise a planar shape. Moreover, semiconductor chips may be arranged on a part of the electrical conductor structures. Another part of the electrical conductor structures may be used for connecting bond wires. In the structuring step, the printed circuit board or the ceramic carrier may be severed such that separate sections of the printed circuit board or the ceramic carrier are provided. In these configurations, the separate sections of the printed circuit board or of the ceramic carrier may constitute the carrier sections of the chip module.

A metallic leadframe itself may be used as a carrier in the production method. As described above, the metallic leadframe may comprise metallic leadframe sections and metallic connection structures connecting the leadframe sections. The connection structures may comprise a web-type shape. In this example, semiconductor chips may be arranged on a part of the leadframe sections. Another part of the leadframe sections may be used for connecting bond wires. In the structuring step of the carrier, connection structures of the leadframe may be severed such that connections of the leadframe sections may be interrupted. As a consequence, separate leadframe sections may be provided. The separate leadframe sections may constitute the carrier sections of the chip module.

The electrically insulating material may be applied on the carrier in the form of a lens structure. In this way, a radiation-emitting chip module may be produced with a predetermined emission characteristic. As an example, the lens structure may be configured such that a focused emission with a narrow angle and a high intensity is made possible. This may be considered, for example, for a spot light or a torch light illumination.

With regard to the above-mentioned example, the electrically insulating material may be a clear and light-transmissive material such as a silicone material. The electrically insulating material may be applied on the carrier by a molding process. Moreover, the lens structure may comprise a plurality of lenses arranged next to one another or, respectively, may be realized in the form of a continuous lens array. Each lens of the lens structure may be assigned to one or several semiconductor chips, and one or several carrier sections produced by the structuring of the carrier.

Furthermore, the semiconductor chips arranged on the carrier may be encapsulated by the electrically insulating material applied on the carrier in the form of the lens structure. In this regard, the provided carrier may comprise a planar shape and may, for example, be a leadframe-based carrier, a printed circuit board or a ceramic carrier. A metallic leadframe may be used as carrier as well.

The chip module produced by the method comprises discrete carrier sections and chip components connected by the electrically insulating material. This configuration allows for a simple singulation of the chip module. In this regard, in accordance with a further example, the chip module is singulated into smaller chip modules by only severing the electrically insulating material.

With regard to the production method, attention is furthermore drawn to the possibility of carrying out the method such that a plurality of chip modules is produced together. In this example, by providing a carrier, arranging semiconductor chips on the carrier and applying an electrically insulating material on the carrier, an assemble of connected and short-circuited modules may be provided. The subsequent step of structuring the carrier may additionally comprise fully severing or, respectively, singulating the module assemblage to provide separate chip modules each having a configuration as described above or, respectively, according to one or several of the above-described examples.

I also provide a chip module. The chip module comprises separate carrier sections connected by an electrically insulating material and semiconductor chips arranged on at least a part of the carrier sections.

The chip module may be produced by carrying out the above-described method or one or more of the above-described examples of the method. Aspects and details mentioned above with regard to the production method may also be applied to the chip module. Conversely, aspects and details specified in the following with regard to the chip module may also be applied to the production method.

As an example, with regard to the carrier sections, the chip module may comprise recesses or, respectively, trenches by which the carrier sections are separated from each other. The recesses or trenches may be present at a back side of the chip module, and may be configured in the form of a continuous grid structure. Moreover, the chip module may comprise chip components connected by the electrically insulating material, each chip component comprising at least one carrier section and at least one semiconductor chip.

The semiconductor chips of the chip module may be radiation-emitting semiconductor chips. In this regard, the chip module may, for example, be a solid state light source, an IR light source or a display module for a video wall. With respect to the latter configuration, the chip module may moreover comprise semiconductor chips configured to generate a first (e.g., red) light radiation, semiconductor chips configured to generate a second (e.g., green) light radiation and semiconductor chips configured to generate a third (e.g., blue) light radiation.

The electrically insulating material may be a flexible material. In a corresponding way, the chip module may be flexible. This configuration makes it possible to mount the chip module, for example, on a curved surface.

The discrete carrier sections of the chip module may be sections of a structured carrier. In other words, the carrier sections may be formed by structuring or, respectively, severing a previously unstructured and continuous carrier in the fabrication of the chip module.

Each carrier section may comprise an electrically insulating carrier material and electrical conductor structures. The semiconductor chips may be arranged on and electrically connected to electrical conductor structures of the carrier sections.

Each carrier section may comprise metallic leadframe sections and a molding compound connected to the leadframe sections. This example may be realized by structuring a leadframe-based carrier in the fabrication of the chip module.

Each carrier section may comprise a molded body formed from the molding compound, the molded body enclosing a cavity. Moreover, the semiconductor chips may be arranged on leadframe sections in the cavities of the molded bodies, and the electrically insulating material may be arranged in areas laterally to and between the molded bodies.

The cavities of the molded bodies may be filled with an encapsulation material. The encapsulation material may, for example, be a clear and light-transmissive material. Alternatively, the encapsulation material may comprise a basic material and phosphor particles embedded therein. In this way, a radiation conversion may be effected by the encapsulation material.

The carrier sections of the chip module may be sections of a printed circuit board or sections of a ceramic carrier comprising electrical conductor structures. In a further example, the carrier sections are sections of a metallic leadframe. These examples may be realized by structuring a printed circuit board, a ceramic carrier or a leadframe in the fabrication of the chip module.

The electrically insulating material may be configured in the form of a lens structure. In this way, the chip module may comprise a predetermined emission characteristic. The lens structure may be realized in the form of a continuous lens array comprising a plurality of connected lenses arranged next to one another. Each lens of the lens structure may be assigned to one or several semiconductor chips, and to one or several carrier sections. Moreover, the semiconductor chips of the chip module may be encapsulated by the lens structure.

The advantageous examples and developments as explained above and/or reproduced in the appended claims may be applied (apart, for example, in clear dependencies or incompatible alternatives) individually or else in arbitrary combination with one another.

The above-described properties, features and advantages and the way in which they are achieved will become clearer and more clearly understood in association with the following description of examples explained in greater detail in association with the schematic drawings.

Examples of methods of producing chip modules 100 are described with reference to the following schematic figures. The chip modules 100 are configured to emit electromagnetic radiation, and may be realized in the form of QFN modules suitable for surface mounting. In this example, processes known from semiconductor technology and from the fabrication of optoelectronic components and modules may be carried out and materials that are customary in these fields may be used, and so they will be discussed only in part. In the same way, the modules may be fabricated with further component parts and structures in addition to components parts and structures shown and described.

The figures are merely of schematic nature and are not true to scale. In this sense, component parts and structures shown in the figures may be illustrated with exaggerated size or size reduction to provide a better understanding. With regard to the figures, a front side or, respectively, a top view of components present in the different stages of the methods is indicated by the reference sign 201. In a similar way, a back side or, respectively, a bottom view is indicated by the reference sign 202. With regard to the top and bottom views, the bottom views show conditions turned by 180° with respect to the top views. Moreover, intersection lines are included in some of the figures illustrating a top and a bottom view that refer to figures illustrating respective conditions in a lateral sectional view. Furthermore, as indicated in the figures, the methods may be carried out such that an assemblage of a plurality of connected modules is fabricated together and subsequently singulated into separate identically constructed chip modules 100. In this regard, the figures illustrate the common production of a plurality of chip modules 100 as an excerpt.

Figure 9:
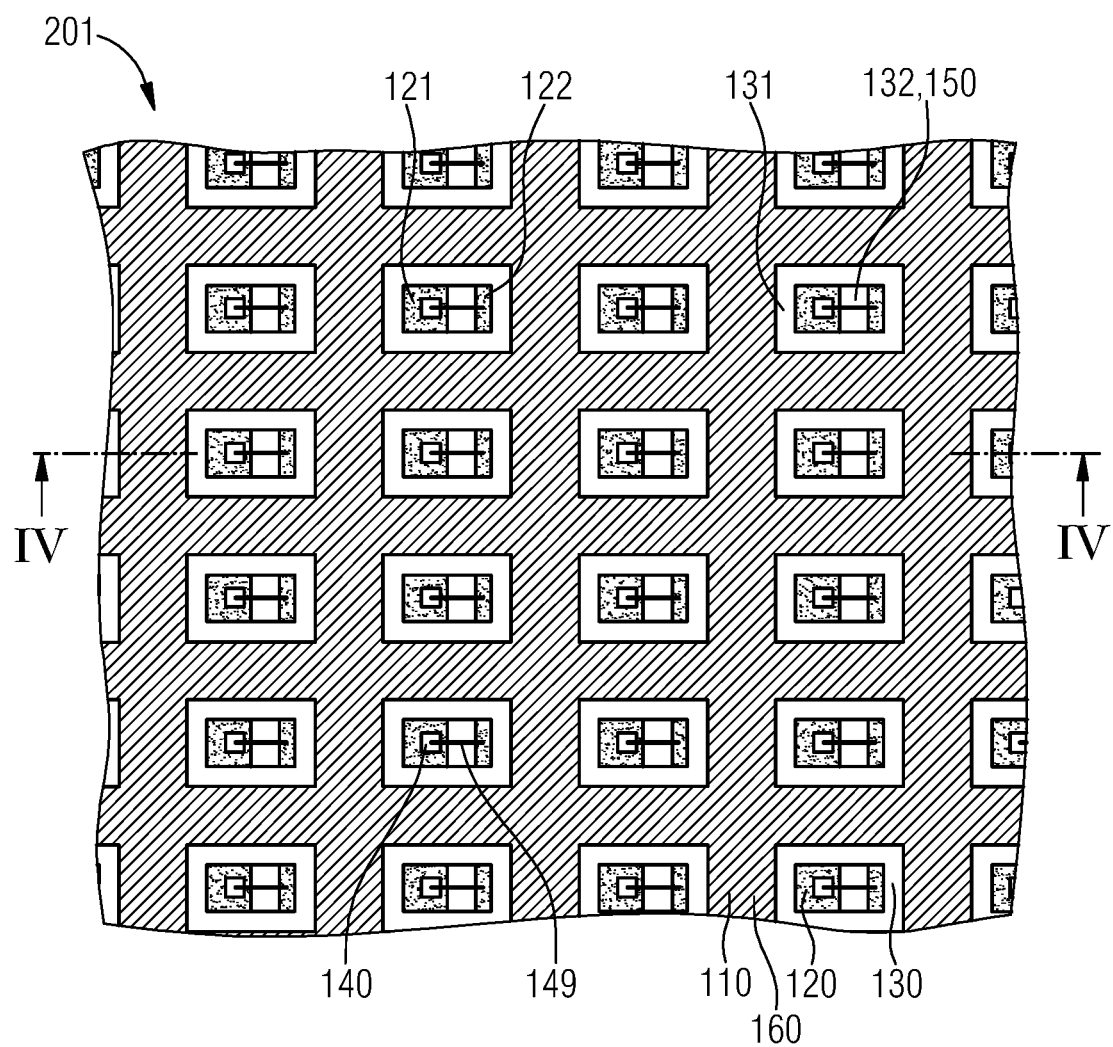
Figure 10:
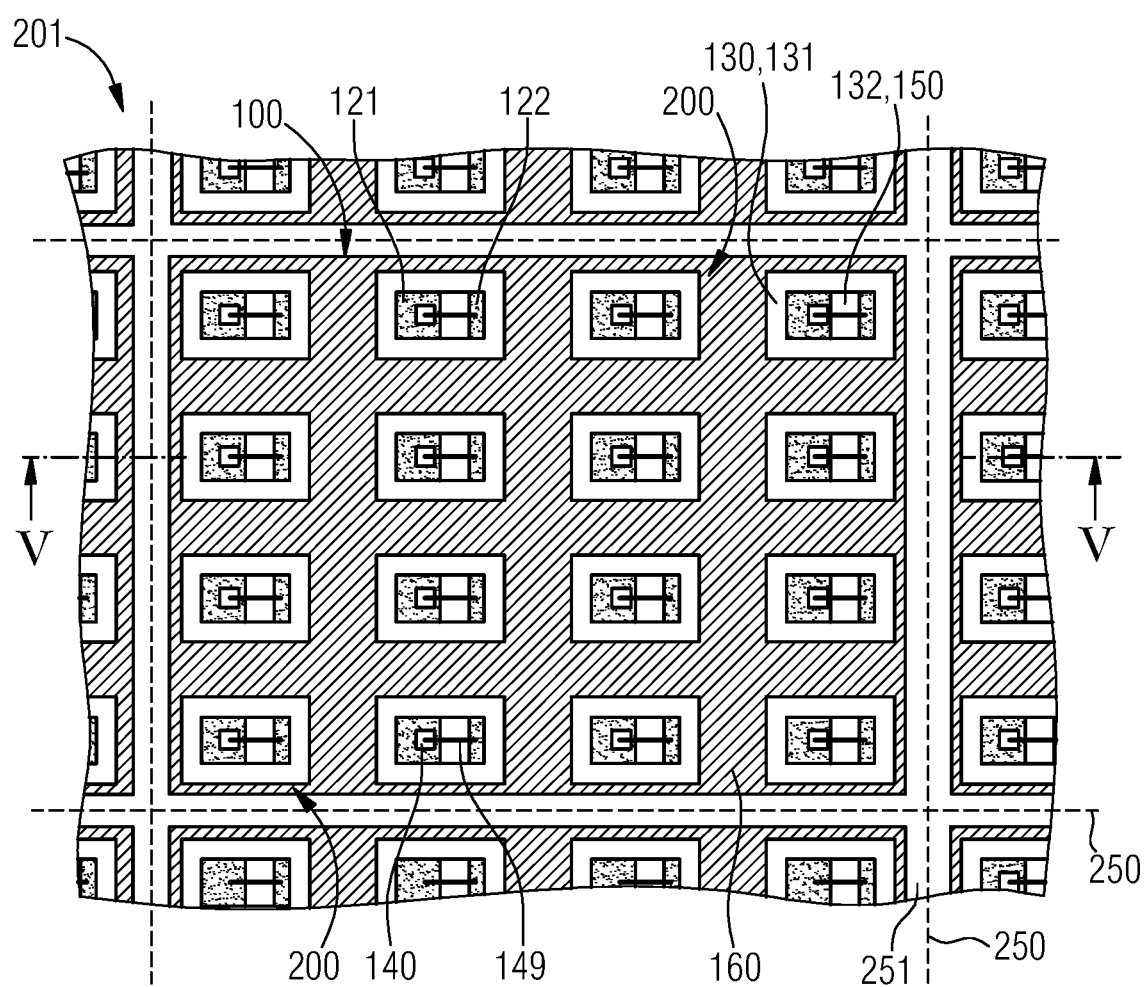
Figure 11:
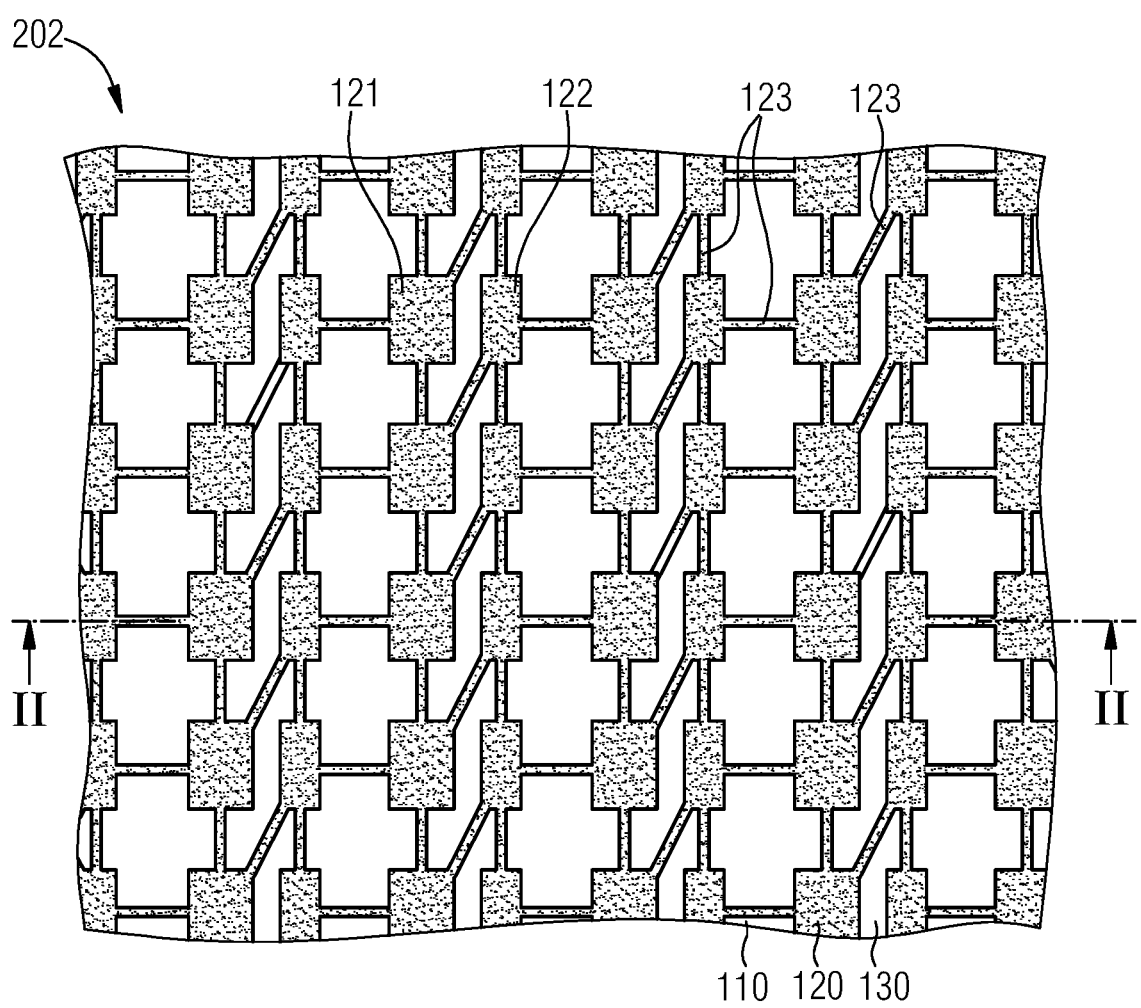
FIGS. 11 and 12 show corresponding bottom views of conditions present in the method of FIGS. 1 to 5.
Figure 12:
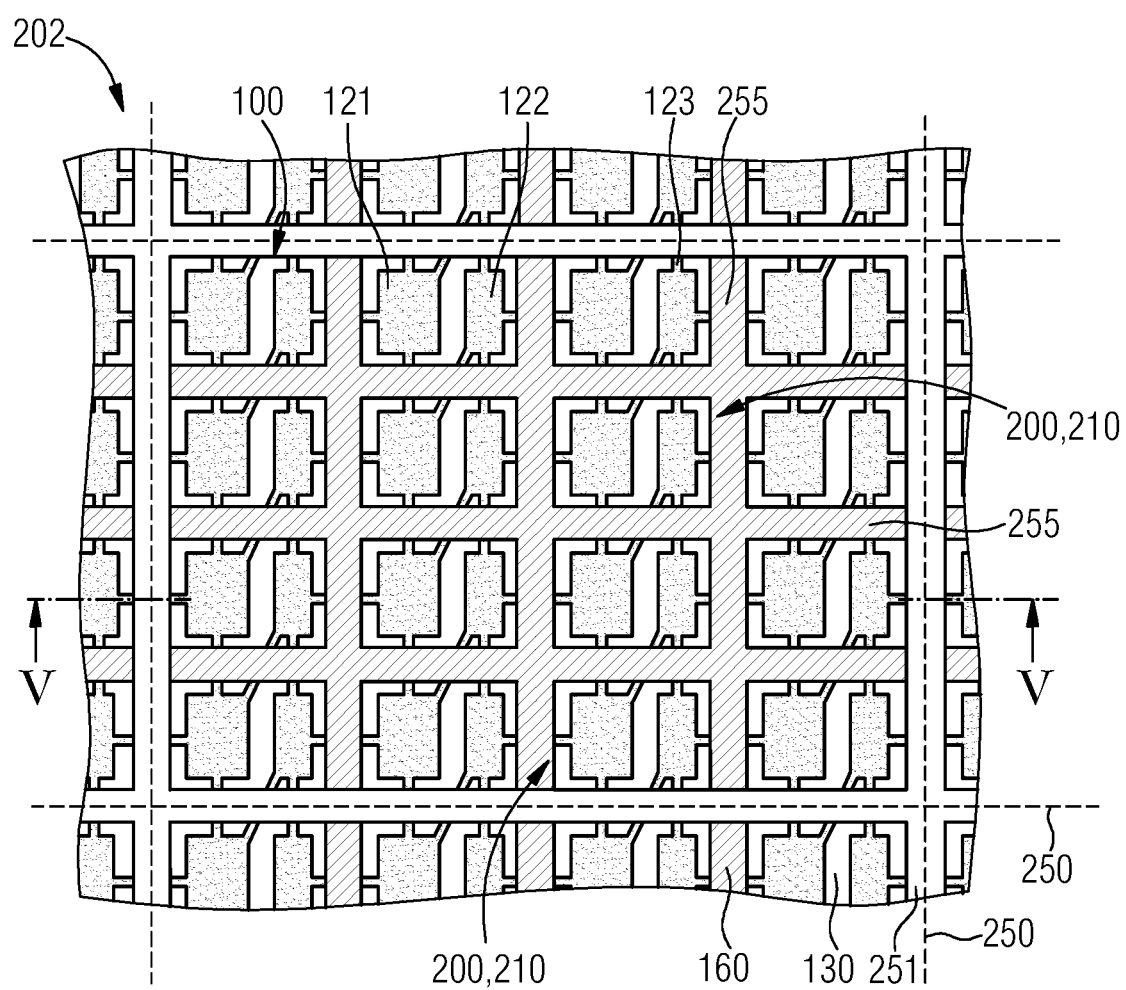

FIGS. 1 to 12 show a possible method of producing radiation-emitting chip modules 100. In the method, a leadframe-based carrier 110 comprising molded bodies 131 with a cavity 132 is used. FIGS. 1 to 5 illustrate the method on the basis of lateral sectional illustrations. FIGS. 6 to 10 show respective top views, and FIGS. 11 and 12 show respective bottom views of conditions present in the method.

At the beginning of the method, a leadframe-based carrier 110 is provided comprising a metallic leadframe 120 and a molding compound 130 connected to the leadframe 120. For this purpose, a metallic leadframe 120 is provided and a molding process is carried out in which the molding compound 130 is molded around the leadframe 120.

Figure 6:
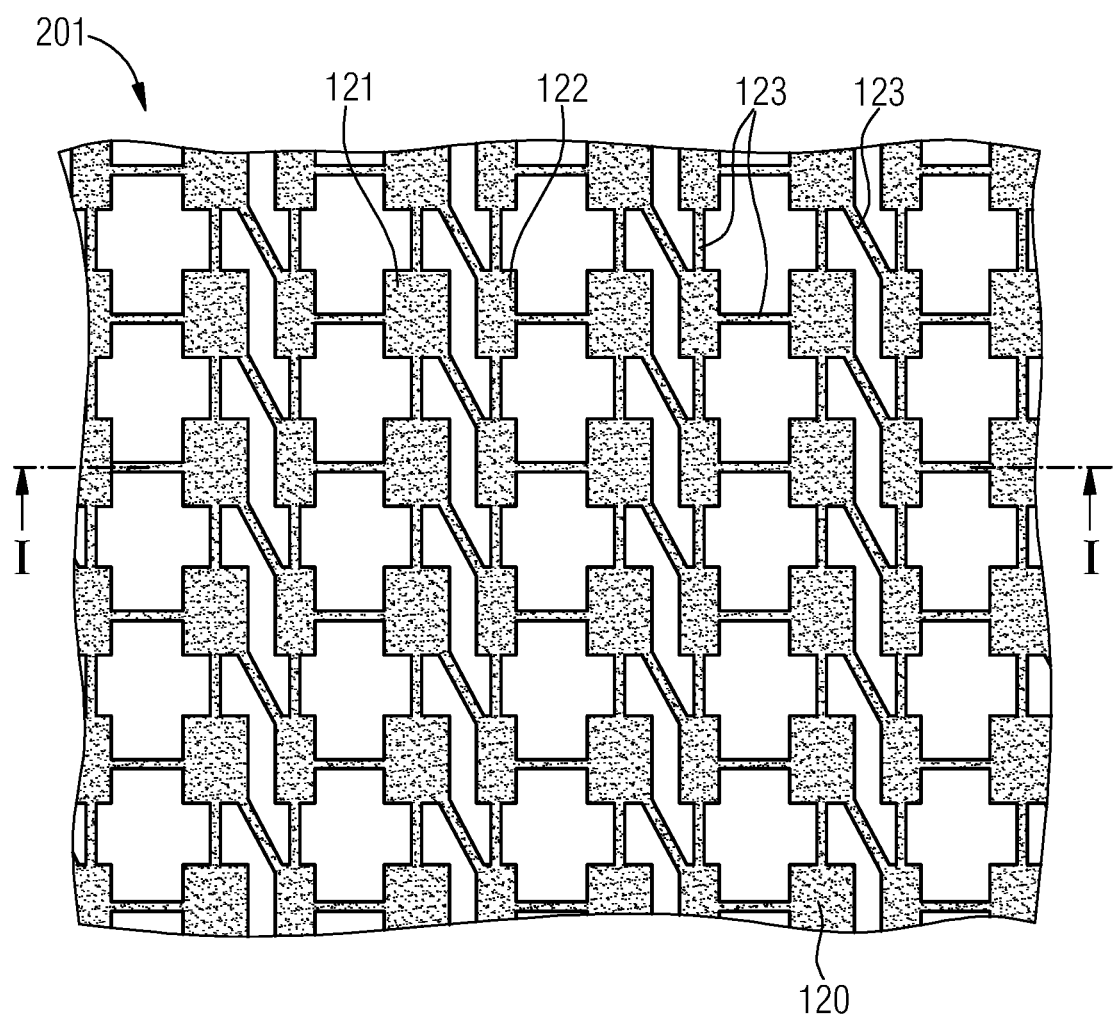
FIGS. 6 to 10 show corresponding top views of conditions present in the method of FIGS. 1 to 5.

FIG. 1 shows a lateral sectional view of the metallic leadframe 120 without the molding compound. A corresponding top view of the leadframe 120 is illustrated in FIG. 6. The leadframe 120 comprises rectangular metallic leadframe sections 121, 122 and web-type metallic connection structures 123 by which the leadframe sections 121, 122 are connected. The leadframe sections 121 comprise bigger lateral dimensions than the leadframe sections 122. Moreover, the leadframe sections 121, 122 are arranged in groups of two leadframe sections 121, 122, each group comprising a leadframe section 121 and a leadframe section 122 that are not directly connected to each other. Each of these groups of leadframe sections 121, 122 is provided for mounting and establishing electrical connections with one semiconductor chip 140 applied in a later stage of the method (see FIGS. 3 and 8).

To provide the metallic leadframe 120, an initial metallic layer may be provided and subsequently structured (not illustrated). Structuring may be carried out by an etching process in which the metallic layer is etched from the front side 201 and from the back side 202 in areas laterally to the leadframe sections 121, 122 and the connection structures 123 to be produced. Moreover, as indicated in FIG. 1, front-side etching may be also carried out in the areas of the connection structures 123 such that the connection structures 123 are half-etched structures and comprise a smaller thickness than the leadframe sections 121, 122. After structuring the metallic layer, consideration may furthermore be given to providing the leadframe 120 with a metallic coating, for example, by electroplating (not illustrated).

Figure 2:
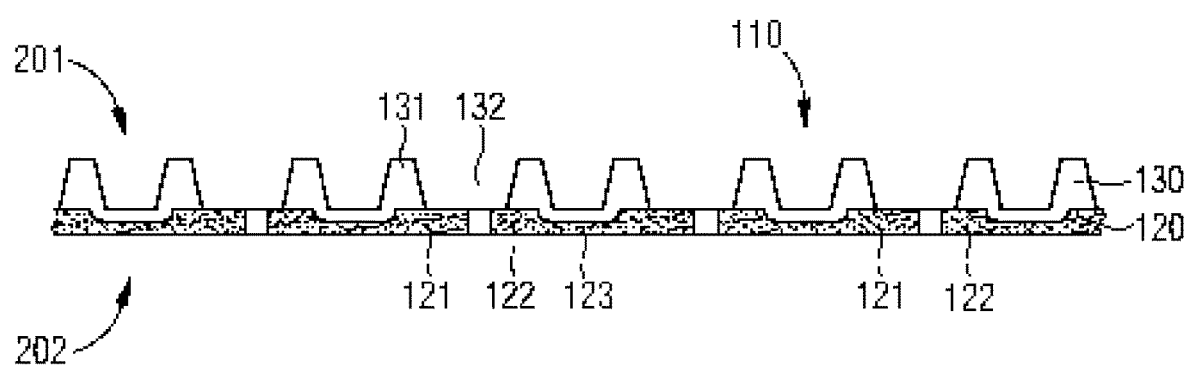
Figure 7:
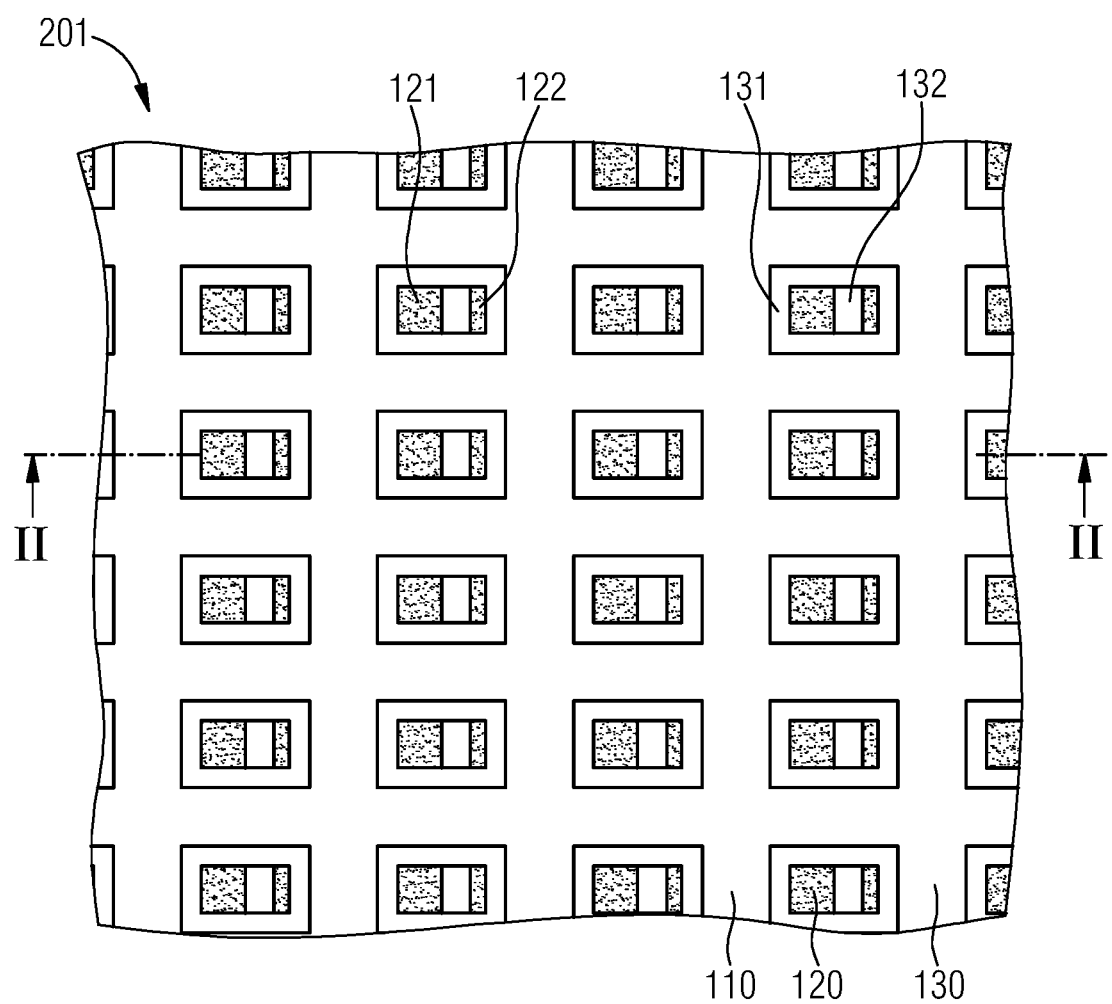

Afterwards, a molding process with an appropriate molding tool is carried out in which the molding compound 130 is molded around the leadframe 120 (not illustrated), thereby providing the leadframe-based carrier 110. FIG. 2 shows a lateral sectional view, and FIGS. 7 and 11 show corresponding top and bottom views of the provided carrier 110. The molding compound 130 may be an electrically insulating plastic material such as PC (Polycarbonate) or PPA (Polyphthalamide).

The molding process is carried out such that the leadframe-based carrier 110 comprises connected molded bodies 131 formed from the molding compound 130, each molded body 131 enclosing a cavity 132. The molded bodies 131 comprise a rectangular frame-type shape, as can be seen from FIG. 7. Each molded body 131 is formed in the area of one of the above-mentioned groups of two leadframe sections 121, 122 such that the respective leadframe sections 121, 122 or, respectively, a part of the same is exposed at the front side 201 of the carrier 110 by the cavity 132 of the corresponding molded body 131. The cavities 132 of the molded bodies 131 comprise a widening cross-sectional shape in a direction away from the leadframe 120, as illustrated in FIG. 2. In this way, the molded bodies 131 may act as reflectors. The connection structures 123 present in areas between the molded bodies 131 are covered by the molding compound 130 at the front side 201 of the carrier 110. In contrast to the front side 201 shown in FIG. 7, the whole leadframe 120 of the carrier 110 is visible at the back side 202, as illustrated in FIG. 11.

Figure 3:
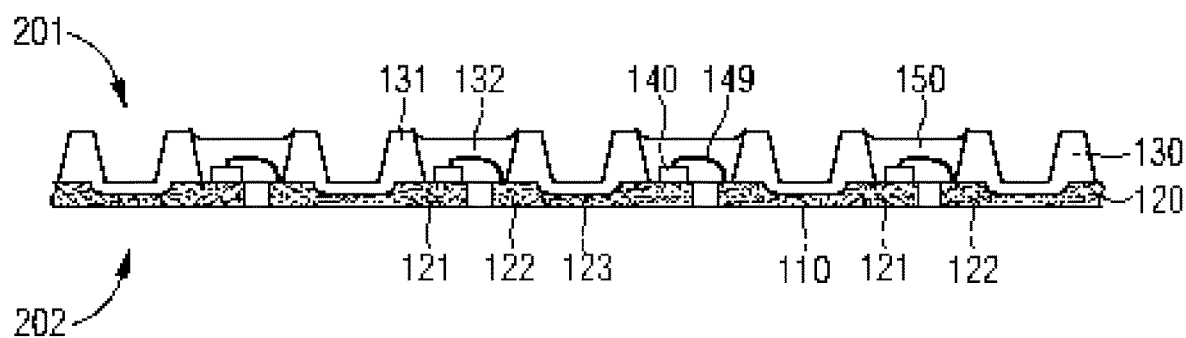
Figure 8:
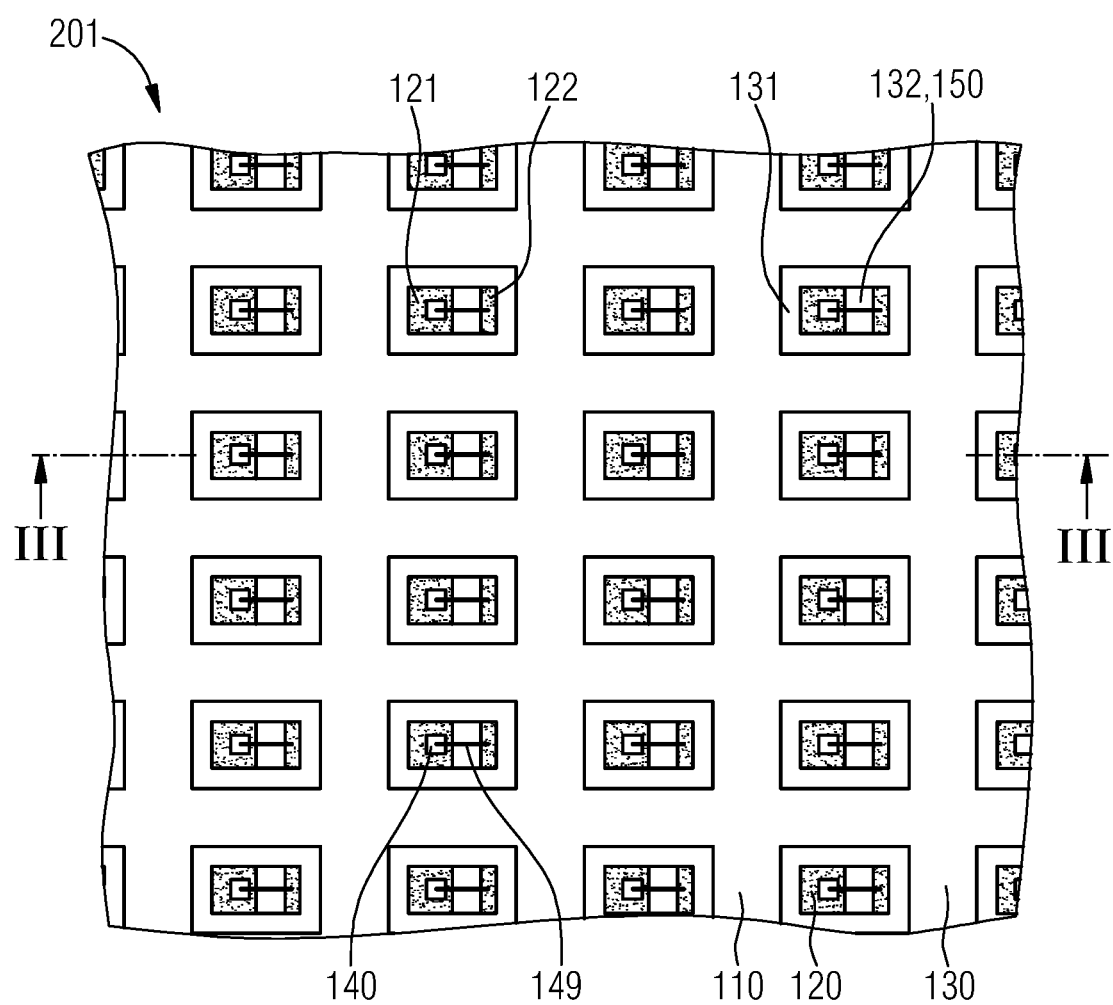

After providing the carrier 110, a die attach process is carried out. In this process, radiation-emitting semiconductor chips 140 are arranged on the front side 201 of the carrier 110 in the cavities 132 of the molded bodies 131 and electrically connect to the leadframe 120, that is to say to the leadframe sections 121, 122 present in the areas of the respective molded bodies 131, as shown in FIG. 3 in a lateral sectional view. In each cavity 132, one semiconductor chip 140 is mounted, as also illustrated in FIG. 8 in a top view. The semiconductor chips 140 may, for example, be light emitting diode chips (LED chips) configured to emit light radiation.

FIGS. 3 and 8 indicate a configuration of the semiconductor chips 140 having a front side contact and a back side contact (not illustrated). In this configuration, each semiconductor chip 140 is arranged on and connected to a leadframe section 121 by the back side contact and applying an electrically conductive material such as solder or an electrically conductive adhesive (not illustrated). The front side contact of each semiconductor chip 140 electrically connects to the adjacent leadframe section 122 by a bond wire 149.

As also illustrated in FIG. 3, the cavities 132 of the molded bodies 131 are subsequently filled with an encapsulation or, respectively, casting material 150. In this way, the semiconductor chips 140 arranged within the cavities 132 may be encapsulated and therefore protected against external influences. The encapsulation material 150 may be a clear and light-transmissive material such as a silicone material. Alternatively, the encapsulation material 150 may be applied for radiation conversion. In this regard, the encapsulation material 150 may comprise a basic material such as a silicone material and phosphor particles embedded therein (not illustrated). In a configuration like this, the encapsulation material 150 may at least partly convert a light radiation generated by the radiation-emitting semiconductor chips 140 during operation into one or a plurality of conversion radiations.

Figure 4:
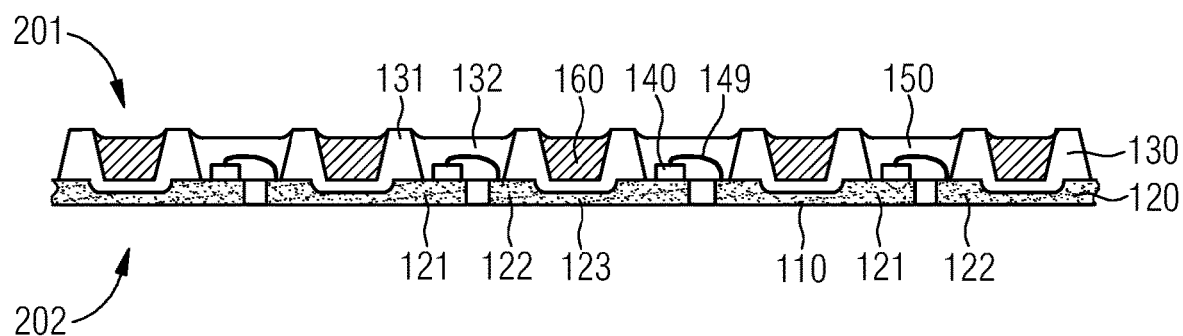

Afterwards, an electrically insulating material 160 is applied on the front side 201 of the carrier 110 in areas laterally to and in between the molded bodies 131 as shown in FIG. 4 in a lateral sectional view and in FIG. 9 in a top view. In this way, an assemblage of connected and short-circuited modules is provided. The electrically insulating material 160 may be a flexible material such as a silicone material. Alternatively, other materials may be used with regard to the electrically insulating material 160. An example is an epoxy material. Applying the electrically insulating material 160 on the carrier 110 may be carried out, for example, by a filling or, respectively, potting process.

Figure 5:
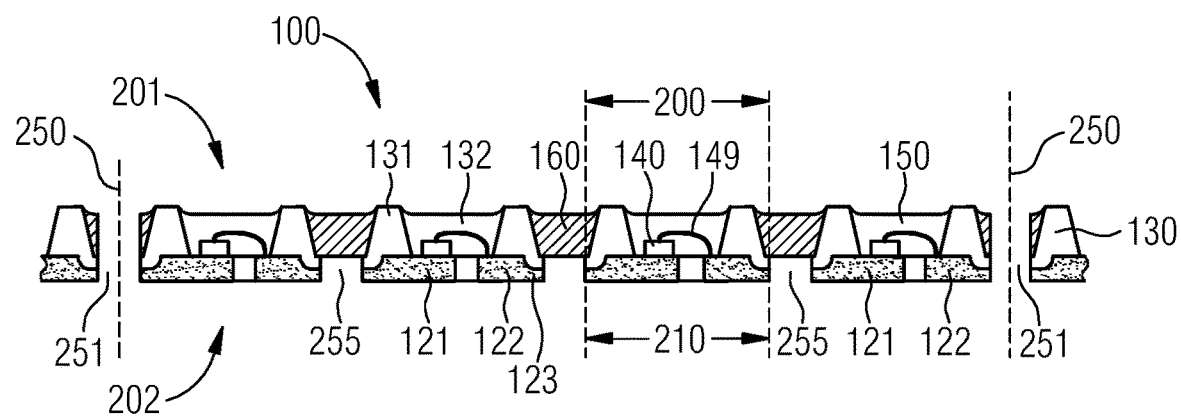

Subsequently, a structuring or, respectively, singulation process is carried out as illustrated in FIG. 5 in a lateral sectional view and in FIGS. 10 and 12 in corresponding top and bottom views. In the structuring step, the carrier 110 and the electrically insulating material 160 are fully severed in areas laterally to and between the molded bodies 131 at separating lines 250 running perpendicularly to each other.

In this way, transections 251 are formed and singulated chip modules 100 are provided. One of these chip modules 100, which may also be referred to as chip panel 100, is fully illustrated in FIGS. 5, 10 and 12.

With regard to each chip module 100, the structuring step furthermore comprises severing the carrier 110 and part of the electrically insulating material 160 in areas laterally to and between the molded bodies 131. In this respect, severing is carried out starting from the back side 202 such that back-side recesses or, respectively trenches 255 running perpendicularly to each other are formed (see FIGS. 5 and 12). The chip modules 100 provided in this way comprise separate rectangular carrier sections 210 that are no longer connected by material of the initial carrier 110 but instead are connected and held together by the electrically insulating material 160. In a similar way, the provided chip modules 100 comprise separate and individual chip, or, respectively, LED components 200 connected and held together by the electrically insulating material 160. In this way, the electrically insulating material 160 may constitute an insulating connector.

As illustrated in FIG. 12, the trenches 255 are produced in the form of a continuous rectangular grid structure and extend to the electrically insulating material 160 such that the electrically insulating material 160 is also visible at the back side 202. Moreover, by the structuring, the connection structures 123 of the metallic leadframe 120 are severed. In this way, the connections of the leadframe sections 121, 122 realized by the connection structures 123 are interrupted such that the groups of leadframe sections 121, 122 that are each associated with one of the semiconductor chips 140 are no longer short-circuited but, instead, are electrically isolated from each other. In a similar way, the carrier sections 210 and the chip components 200 of the chip modules 100 produced by the structuring are electrically isolated from each other. In this sense, forming the trenches 255 may be also referred to as partial singulation.

The structuring step may be carried out by a mechanical process (not illustrated). As an example, a sawing or cutting process may be carried out. Another possible process is laser cutting.

The discrete carrier sections 210 of the chip modules 100 each comprise two separate leadframe sections 121, 122 and the molding compound 130 connected to the same. Residues of the severed connection structures 123 are present at the edges of the leadframe sections 121, 122. Each carrier section 210 furthermore comprises a respective molded body 131 formed from the molding compound 130 and enclosing a cavity 132.

The chip components 200 of the chip modules 100 each comprise a respective carrier section 210 and a radiation-emitting semiconductor chip 140 arranged on the carrier section 210 within the cavity 132 of the respective molded body 131. The semiconductor chip 140 is furthermore encapsulated by the encapsulation material 150. Each chip component 200 and thus the corresponding semiconductor chip 140 may be separately and independently powered by the corresponding leadframe sections 121, 122. A light radiation generated during operation of the semiconductor chips 140 may be emitted from the encapsulation material 150 of the chip components 200 (not illustrated).

The chip modules 100 may, for example, be used as a solid state lighting source in general lighting applications. In this regard, the above-described method may, for example, be carried out such that semiconductor chips 140 configured to emit a blue light radiation and an encapsulation material 150 configured to at least partly convert the blue light radiation into one or a plurality of conversion radiations (for example, a yellow light radiation) are applied, thus making it possible to emit a white light radiation during operation.

Another possible application example that may be considered for the chip modules 100 is IR (Infrared) illumination, for example, for CCTV (Closed Circuit Television). In this regard, semiconductor chips 140 configured to emit an infrared light radiation and a clear and light-transmissive encapsulation material 150 may be applied.

As described above, the method involves arranging semiconductor chips 140, in other words bare unpackaged dies, on the carrier 110. This makes it possible to produce the chip modules 100 such that the semiconductor chips 140 are arranged in close proximity to each other. As a consequence, the chip modules 100 may provide a homogeneous illumination over a wide area.

Figure 13:
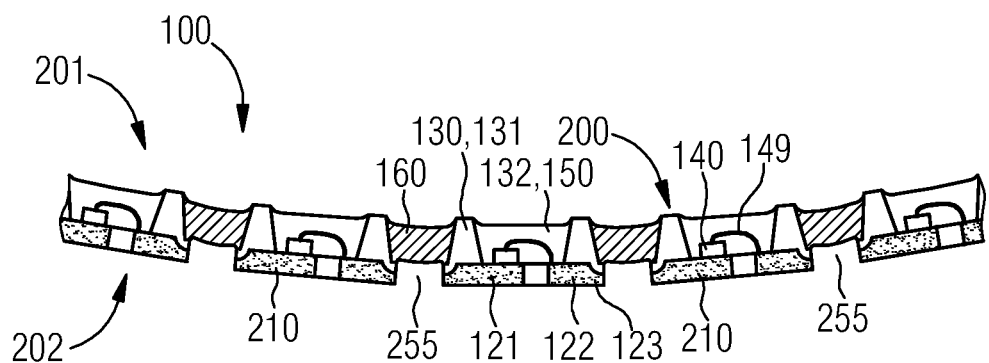
FIG. 13 shows a lateral illustration of a chip module including a curved shape.

Furthermore, as described above, the electrically insulating material 160 applied in the production method may be a flexible material. In a similar way, the chip modules 100 produced by the method may comprise a flexible construction. This configuration makes it possible to bend each chip module 100 such that the respective chip module 100 comprises a bent or, respectively, curved shape as illustrated in an exemplary manner in FIG. 13 in a lateral sectional view. In this way, the chip module 100 may, for example, be mounted on a curved surface (not illustrated). It is pointed out, that apart from the convex shape depicted in FIG. 13, the chip modules 100 may be brought into other forms including, for example, a concave shape.

Figure 14:
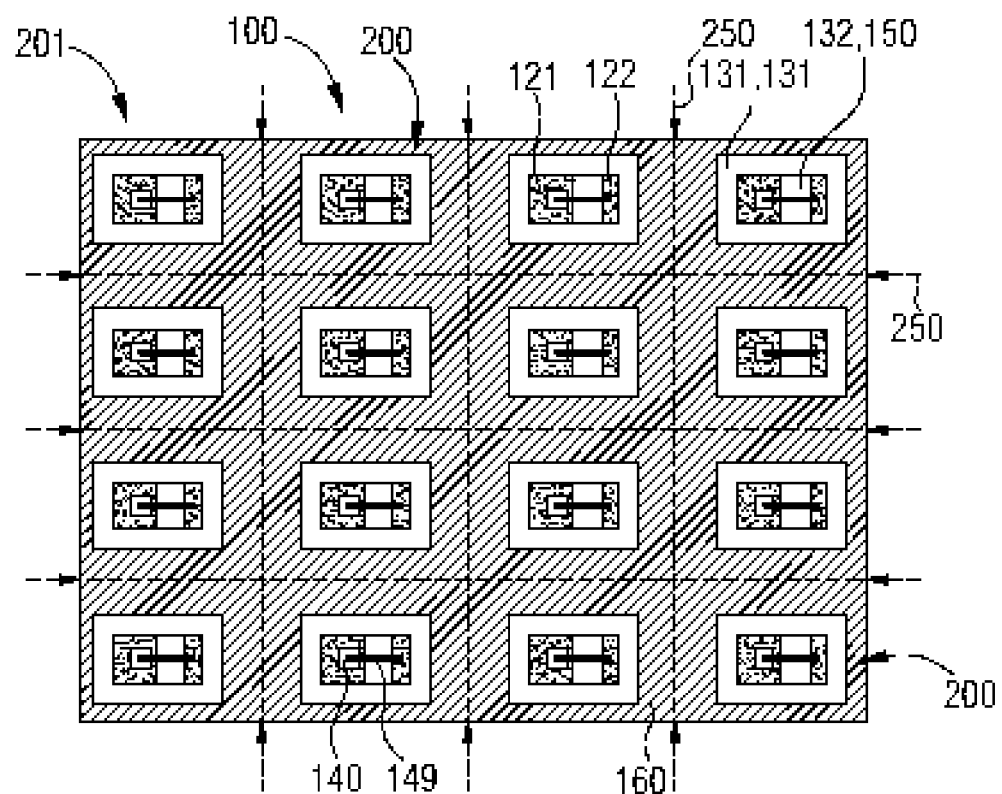
FIG. 14 shows a top view of a chip module, wherein separating lines for separating the chip module are additionally illustrated.

FIG. 14 shows a further top view of a chip module 100 that may be produced by the above-described method. The chip module 100 comprises a rectangular outline and a 4×4 matrix of chip components 200 connected by the electrically insulating material 160. Apart from the depicted configuration, chip modules 100 with other or, respectively, bigger matrix sizes such as chip modules 100 with a 100×100 matrix may be fabricated by carrying out the method (not illustrated).

Figure 15:
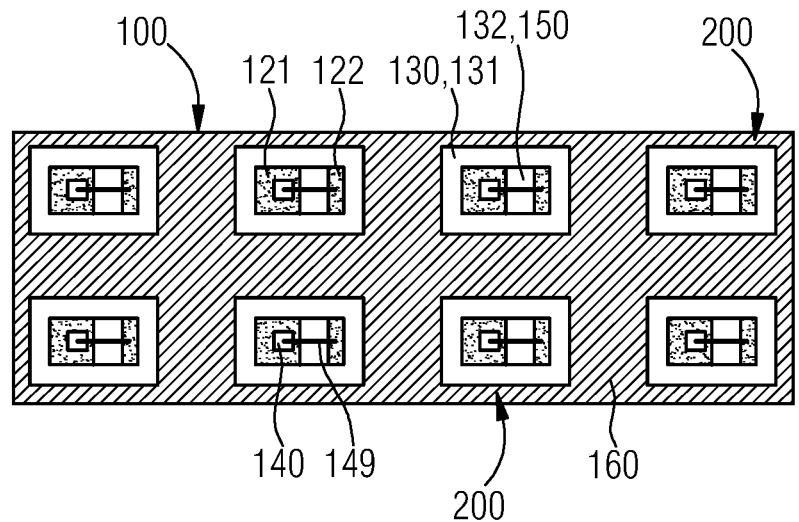
FIGS. 15 to 17 show top views of further chip modules with different sizes.
Figure 16:
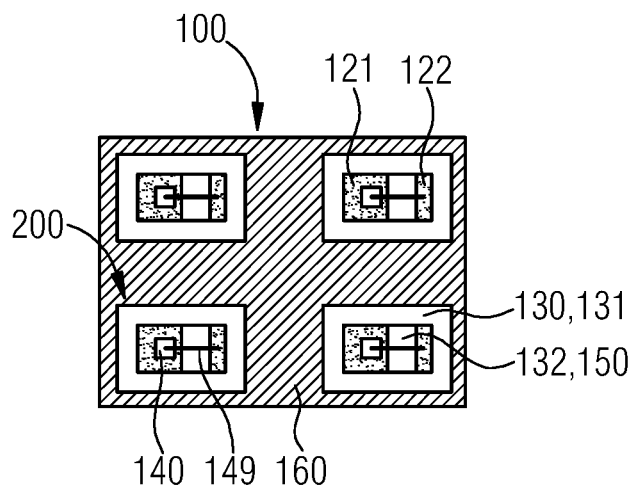
Figure 17:
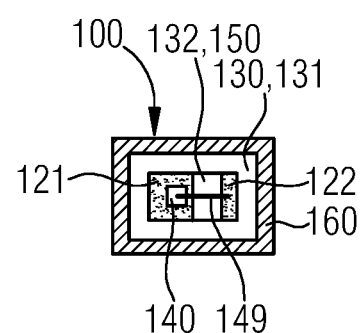

FIG. 14 furthermore illustrates the simple possibility of further singulating a produced chip module 100 into smaller chip modules 100 by only severing the electrically insulating material 160 at respective separating lines 250 between the chip components 200. In this way, for example, chip modules 100 with a 4×2 matrix of chip components 200 as shown in FIG. 15, chip modules 100 with a 2×2 matrix of chip components 200 as shown in FIG. 16, or even chip modules 100 in the form of a single unit comprising one semiconductor chip 140 as shown in FIG. 17 may be produced.

Further variants and examples of a method of producing chip modules 100 and of chip modules 100 produced are described below. Corresponding features and aspects and also identical and identically acting component parts will not be described in detail again hereinafter. Instead, for details in respect thereof, reference is made to the above description. Furthermore, attention is drawn to the possibility of combining with one another features of two or more of the examples described here.

Figure 18:
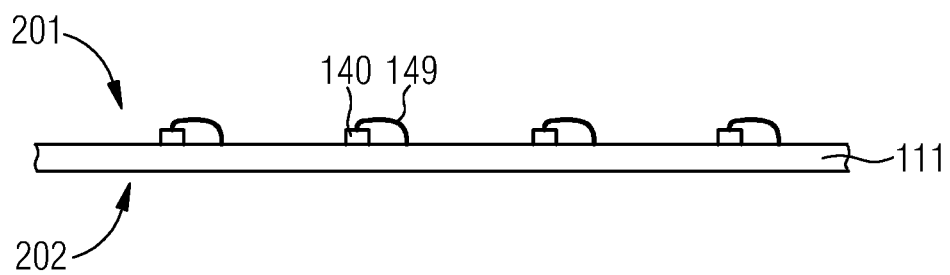
FIGS. 18 to 20 show a further method sequence of producing a chip module on the basis of lateral illustrations, including arranging radiation-emitting semiconductor chips on a planar carrier, applying an electrically insulating material on the carrier in the form of a lens structure, and carrying out a structuring process such that the chip module is provided, wherein the chip module includes separate carrier sections produced by the structuring and connected by the electrically insulating material configured in the form of the lens structure.
Figure 19:
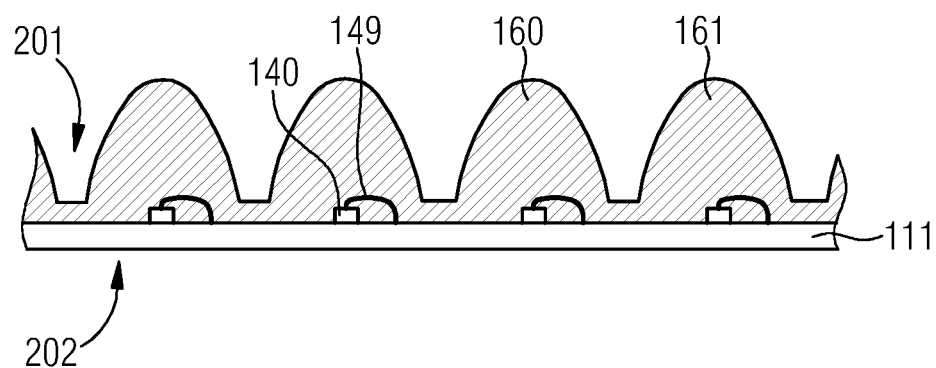
Figure 20:
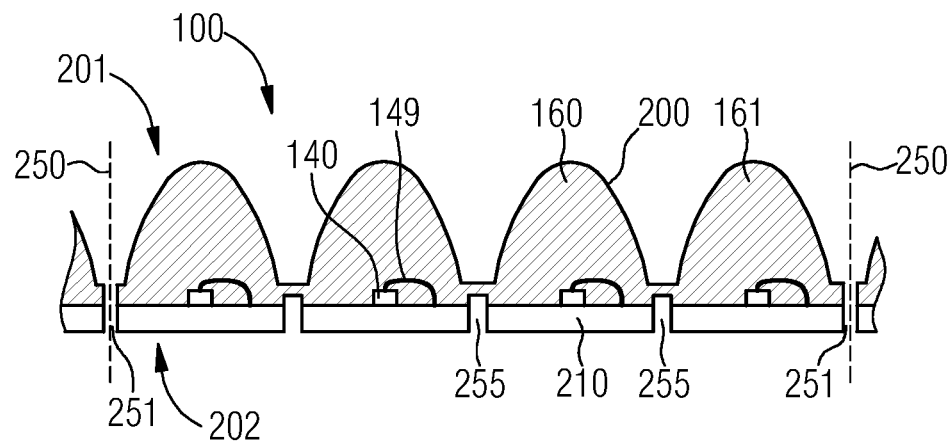
Figure 21:
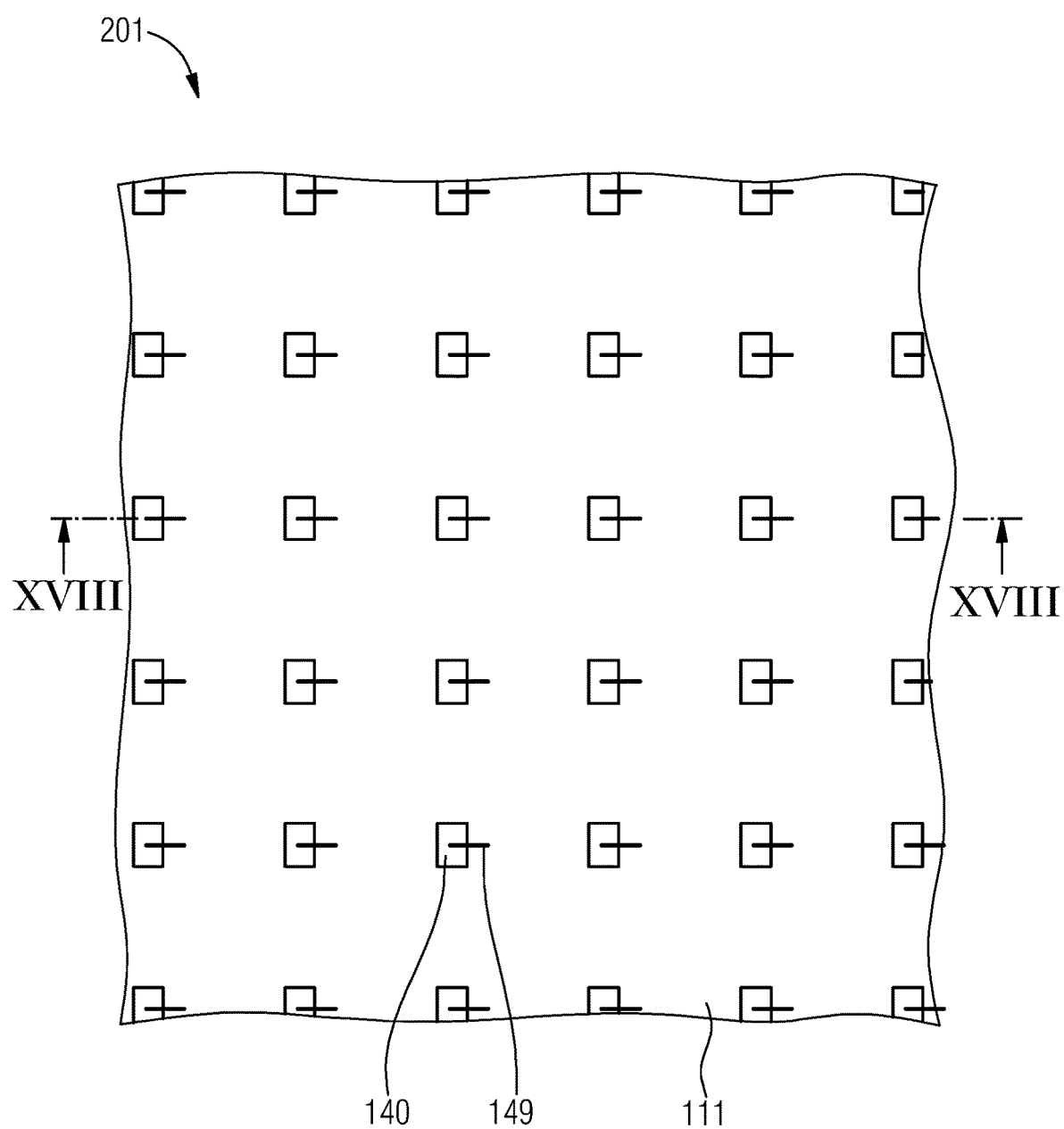
FIGS. 21 to 23 show corresponding top views of conditions present in the method of FIGS. 18 to 20.
Figure 22:
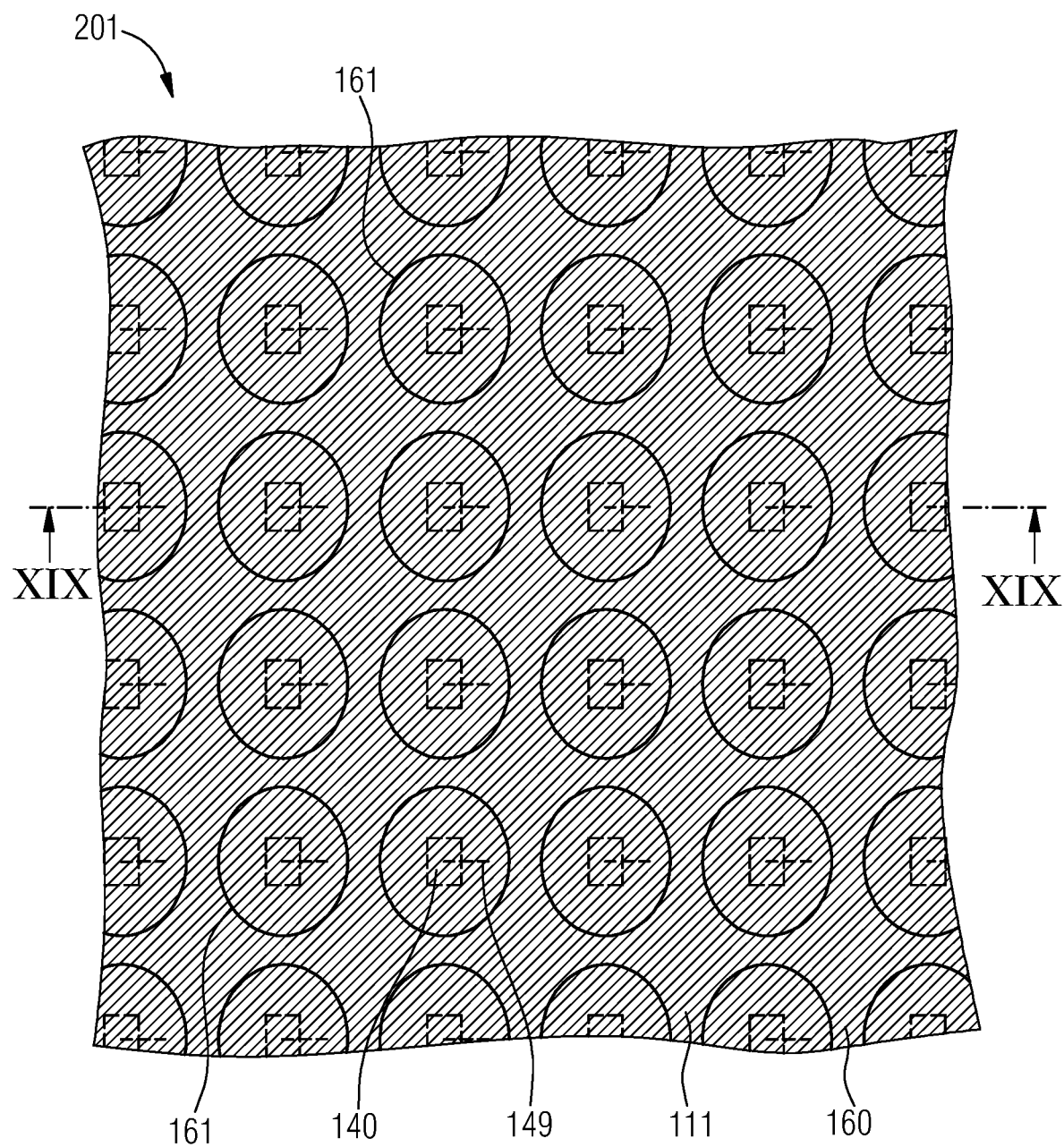
Figure 23:
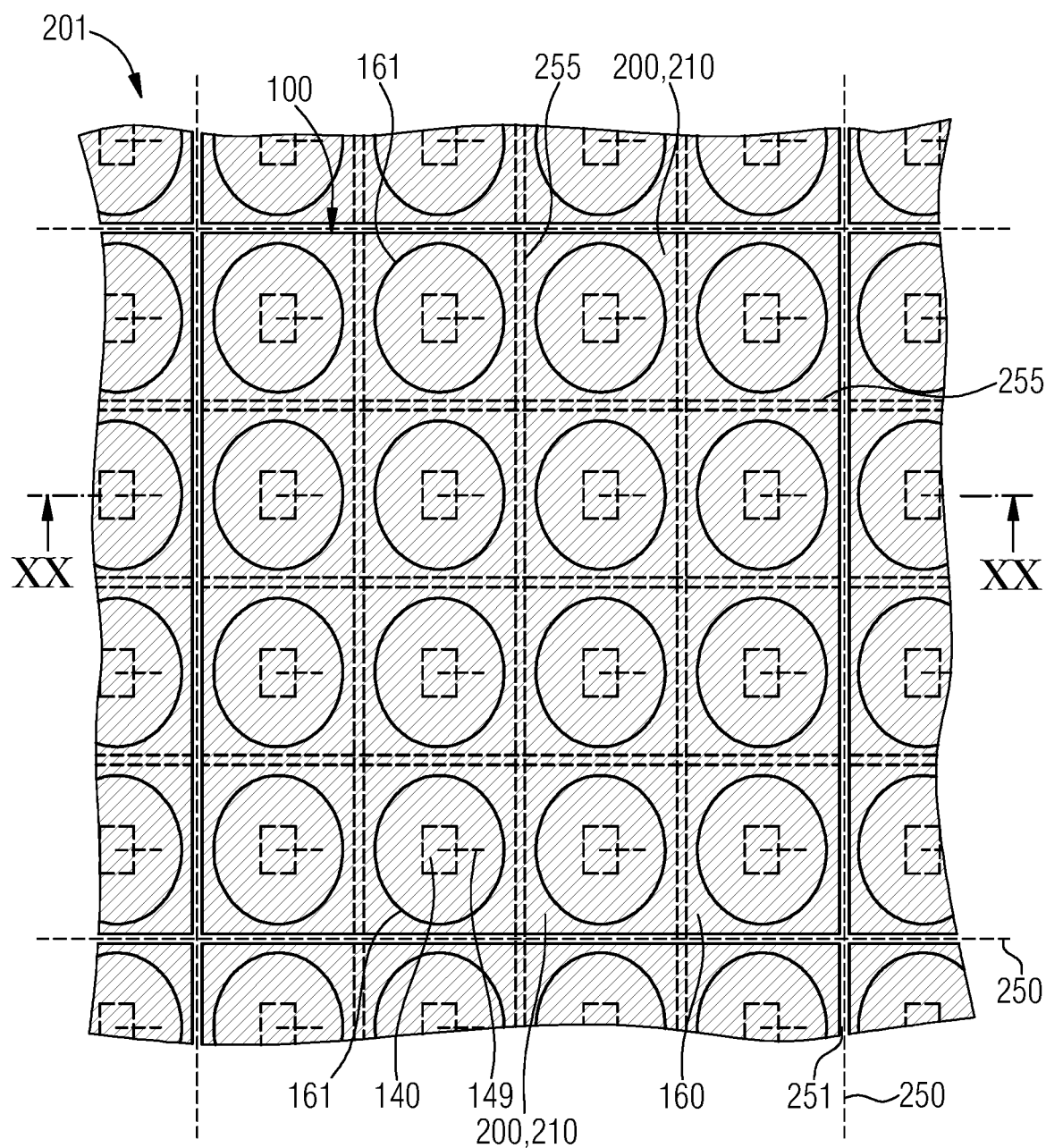

FIGS. 18 to 23 show a further possible method of producing radiation-emitting chip modules 100. FIGS. 18 to 20 illustrate the method on the basis of lateral sectional views. FIGS. 21 to 23 show respective top views of conditions present in the method.

The method comprises providing a planar carrier 111 and arranging radiation-emitting semiconductor chips 140 on a front side 201 of the carrier 111, as illustrated in FIGS. 18 and 21. In the context of arranging the semiconductor chips 140 on the carrier 111, electrical connections between the semiconductor chips 140 and the carrier 111 are produced. In this regard, similar to the above-described production method, mounting the semiconductor chips 140 on the carrier 111 and establishing electrical connections are carried out by processes such as soldering or gluing and wire bonding. With regard to establishing electrical connections, the carrier 111 comprises electrical conductor structures (not illustrated) to which the semiconductor chips 140 are connected by an electrically conductive material (not illustrated) and by bond wires 149. Possible configurations that may be considered for the carrier 111 are described further below.

Afterwards, an electrically insulating material 160 is applied on the front side 201 of the carrier 111 in the form of a lens structure, as illustrated in FIG. 19 in a lateral sectional view and in FIG. 22 in a top view. The semiconductor chips 140 are encapsulated by the electrically insulating material 160. The lens structure is realized in the form of a continuous array or, respectively, cluster comprising a plurality of connected lenses 161 arranged next to one another. Each lens 161 is assigned to and provided in the area of one of the semiconductor chips 140. The electrically insulating material 160 may be a clear and light-transmissive material such as a silicone material. Applying the electrically insulating material 160 on the carrier 111 in the form of the lens structure may, for example, be carried out by a molding process with an appropriate molding tool (not illustrated).

Subsequently, a structuring or, respectively, singulation process is carried out as shown in FIG. 20 in a lateral sectional view and in FIG. 23 in a top view. In this step, the carrier 111 and the electrically insulating material 160 are fully severed in areas laterally to and between the lenses 161 at separating lines 250 running perpendicularly to each other. In this way, transections 251 are formed and singulated chip modules 100 are provided. One of these chip modules 100 is fully illustrated in FIGS. 20 and 23.

With regard to each chip module 100, the structuring step furthermore comprises severing the carrier 111 and part of the electrically insulating material 160 in areas laterally to and between the lenses 161. In this way, the chip modules 100 comprise separate rectangular and electrically isolated carrier sections 210, and therefore also separate and individual chip components 200 that are connected and held together by the electrically insulating material 160. In this regard, severing is carried out starting from the back side 202 to produce back-side recesses or, respectively, trenches 255 in the form of a continuous rectangular grid structure that extend to the electrically insulating material 160.

The chip components 200 of the chip modules 100 each comprise a carrier section 210 produced by the structuring of the carrier 111, and a radiation-emitting semiconductor chip 140 and a lens 161 arranged thereon. Each chip component 200 and thus the corresponding semiconductor chip 140 may be separately and independently powered. A light radiation generated during operation of the semiconductor chips 140 may be emitted from the electrically insulating material 160 or, respectively, the lens 161 of the chip components 200 (not illustrated). By the lens array, a predetermined emission characteristic, for example, a focused light emission with a narrow angle and a high intensity is made possible. This may be considered, for example, for a spot light illumination.

With regard to the method described with reference to FIGS. 18 to 23, it is again possible to apply semiconductor chips 140 configured to generate an infrared light radiation such that the chip modules 100 may be used for IR illumination applications.

Moreover, a radiation conversion may be provided such that the chip modules 100 may emit a white light radiation. For this purpose, the radiation-emitting semiconductor chips 140 may be provided with a respective conversion material configured for radiation conversion or, respectively, a conversion material may be applied on the semiconductor chips 140 before applying the electrically insulating material 160 on the carrier 111 (not illustrated). In this regard, each semiconductor chip 140 may, for example, be provided with a conversion material in the form of a coating or platelet.

With respect to the electrically insulating material 160, it is again possible to apply a flexible material. In this way, the chip modules 100 produced with the lens structure may comprise a flexible construction, thus making it possible to bend the chip modules 100 such that chip modules 100 may, for example, be assembled on a curved surface (not illustrated).

Figure 24:
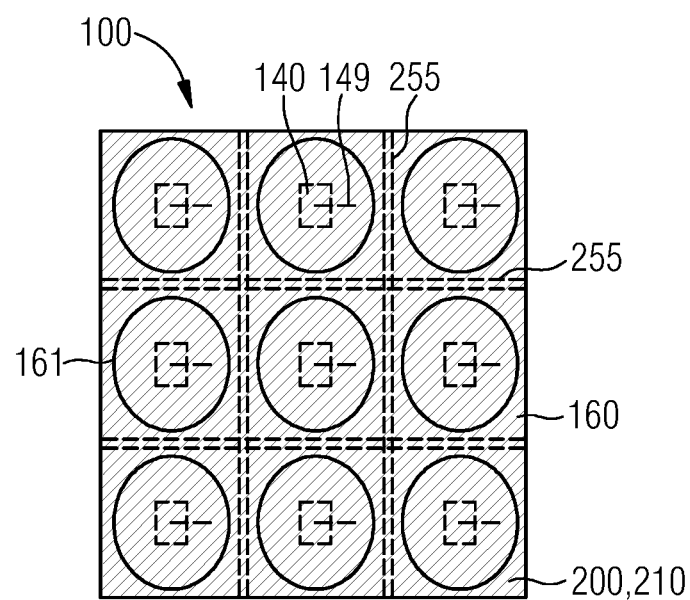
FIGS. 24 to 26 show top views of further chip modules with different sizes including a lens structure.
Figure 25:
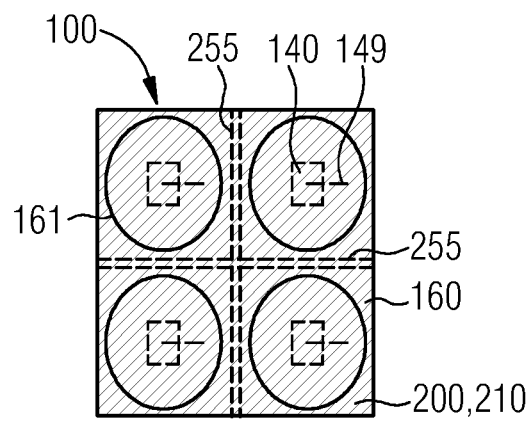
Figure 26:
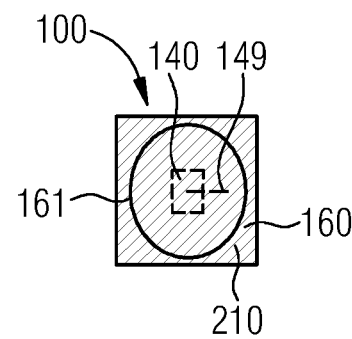

As illustrated in FIG. 23, the chip modules 100 may comprise a 4×4 matrix of chip components 200. It is also possible to produce chip modules 100 with other or, respectively, bigger matrix sizes (not illustrated). Moreover, it is possible to further singulate the chip modules 100 into smaller chip modules 100 by only severing the electrically insulating material 160 between the chip components 200. In this way, for example, chip modules 100 with a 3×3 matrix as shown in FIG. 24, chip modules 100 with a 2×2 matrix as shown in FIG. 25 or chip modules 100 in the form of a single unit comprising one semiconductor chip 140 as shown in FIG. 26 may be produced.

With regard to the planar carrier 111 applied in the method sequence illustrated in FIGS. 18 to 23, different configurations may be considered as described in the following with reference to FIGS. 27 and 28.

Figure 27:
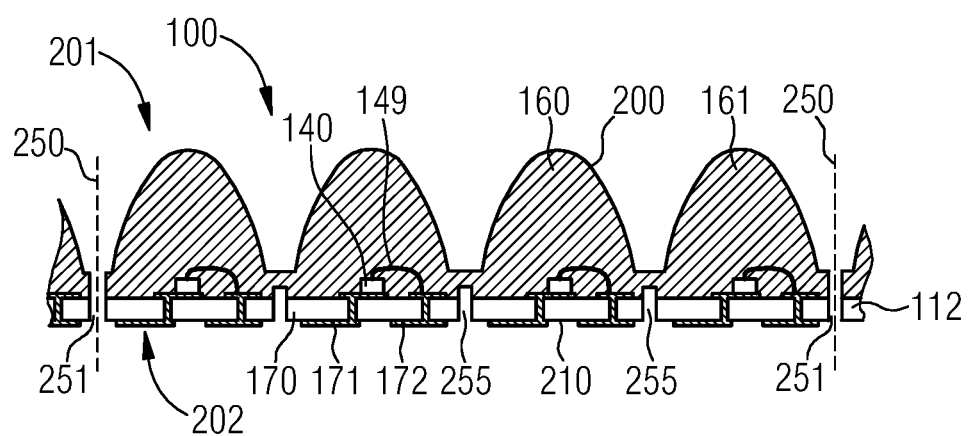
FIG. 27 shows a lateral illustration of the production of a chip module including a lens structure, wherein a planar carrier including an electrically insulating carrier material and electrical conductor structures is used.

As shown in FIG. 27 in a lateral sectional view, production of chip modules 100 with a lens structure may be carried out by applying a planar carrier 112 comprising an electrically insulating carrier material 170 and electrical or, respectively, metallic conductor structures 171, 172. The conductor structures 171, 172 comprise front- and back-side sections and via sections extending vertically through the carrier 112 and connecting the front- and back-side sections. The conductor structures 171, 172 are arranged in groups, each group comprising a conductor structure 171 and a conductor structure 172. Each of these groups is provided for mounting and establishing electrical connections with one semiconductor chip 140.

As indicated in FIG. 27, after providing the carrier 112, the semiconductor chips 140 are arranged on the conductor structures 171, for example, by carrying out processes such as soldering or gluing and electrically connect to the adjacent conductor structures 172 by bond wires 149. Afterwards, the above-described steps, that is to say applying the electrically insulating material 160 in the form of the lens structure on the front side 201 of the carrier 112 and subsequently structuring the carrier 112 and the electrically insulating material 160, are carried out. In the structuring step, the carrier 112 and the electrically insulating material 160 are fully severed at separating lines 250 to provide singulated chip modules 100. Moreover, trenches 255 are formed at the back side 202 such that the chip modules 100 comprise separate carrier sections 210 and therefore chip components 200 connected by the electrically insulating material 160.

The carrier sections 210 produced by the structuring of the carrier 112 each comprise two electrical conductor structures 171, 172 and the electrically insulating carrier material 170. The chip components 200 of the chip modules 100 each comprise a carrier section 210, and a radiation-emitting semiconductor chip 140 and a lens 161 arranged thereon. Each chip component 200 and thus the corresponding semiconductor chip 140 may be independently powered by the corresponding electrical conductor structures 171, 172.

The carrier 112 applied in the above-described method may, for example, be a printed circuit board (PCB). In this regard, the carrier material 170 may, for example, be a FR4 material. Alternatively, the carrier 112 may, for example, be a ceramic carrier comprising a ceramic carrier material 170.

Figure 28:
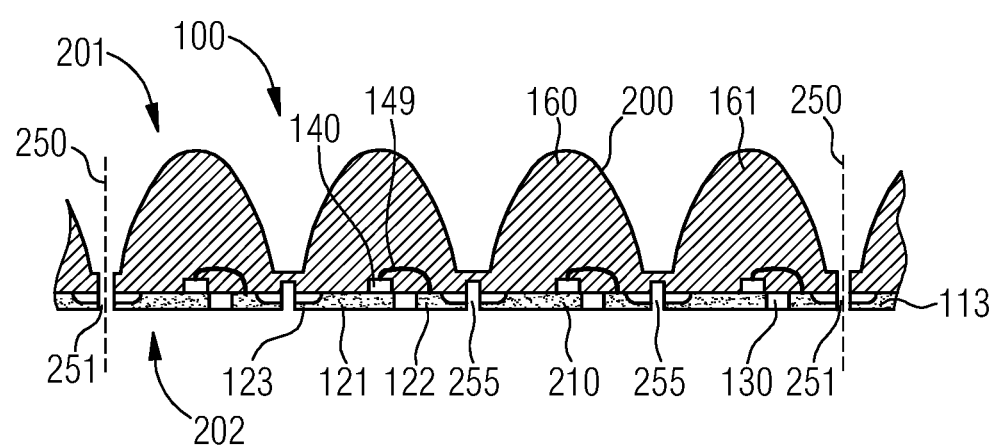
FIG. 28 shows a lateral illustration of the production of a chip module including a lens structure, wherein a planar leadframe-based carrier is used.

FIG. 28 shows, in a lateral sectional view, another variant of a method of producing chip modules 100 with a lens structure. In the method, a planar leadframe-based carrier 113 is applied. The carrier 113 comprises a metallic leadframe 120 and a molding compound 130 connected to the leadframe 120. The leadframe 120 comprises the above-described structure, that is to say leadframe sections 121, 122 and web-type connection structures 123 by which the leadframe sections 121, 122 are connected. The leadframe sections 121, 122 are arranged in groups, each group comprising a leadframe section 121 and a leadframe section 122. Each of these groups is provided to mount and establish electrical connections with one semiconductor chip 140. Viewed from above, the leadframe 120 may have an appearance as shown in FIG. 6.

To provide the leadframe-based carrier 113, the leadframe 120 is provided as described above, and a molding process is carried out in which the molding compound 130 is molded around the leadframe 120. The molding process is carried out such that the leadframe-based carrier 113 comprises a planar shape with a planar front side 201 and a planar back side 202 constituted of the leadframe 120 and the molding compound 130. Viewed from below, the provided carrier 113 may have an appearance as shown in FIG. 11. With regard to the top view, only the leadframe sections 121, 122 of the leadframe 120 are visible because the connection structures 123 are covered by the molding compound 130 (not illustrated).

As indicated in FIG. 28, after providing the leadframe-based carrier 113, the semiconductor chips 140 are mounted on the leadframe sections 121, for example, by carrying out processes such as soldering or gluing and electrically connect to the adjacent leadframe sections 122 by bond wires 149. Subsequently, the above-described steps, that is to say applying the electrically insulating material 160 in the form of the lens structure on the front side 201 of the carrier 113 and afterwards structuring the carrier 113 and the electrically insulating material 160, are carried out. In the structuring step, the carrier 113 and the electrically insulating material 160 are fully severed at separating lines 250 to provide singulated chip modules 100. Moreover, trenches 255 are formed at the back side 202 such that the chip modules 100 comprise separate carrier sections 210 and therefore chip components 200 connected by the electrically insulating material 160. In this regard, the connection structures 123 of the metallic leadframe 120 are severed such that the groups of leadframe sections 121, 122 that are each associated with one of the semiconductor chips 140 are no longer short-circuited but instead are electrically isolated from each other. In a similar way, the carrier sections 210 and chip components 200 of the chip modules 100 produced by the structuring are electrically isolated from each other. Viewed form below, the chip modules 100 may have an appearance as shown in FIG. 12.

The carrier sections 210 produced by the structuring of the carrier 113 each comprise two separate leadframe sections 121, 122 and the molding compound 130 connected to the same. The chip components 200 of the chip modules 100 each comprise a carrier section 210, and a radiation-emitting semiconductor chip 140 and a lens 161 arranged thereon. Each chip component 200 and thus the corresponding semiconductor chip 140 may be independently powered by the corresponding leadframe sections 121, 122.

Producing chip modules 100 may also be carried out using a leadframe 120 itself as a carrier. In this regard, FIGS. 29 to 31 show a further possible method of producing chip modules 100 with a lens structure on the basis of lateral sectional illustrations.

Figure 29:
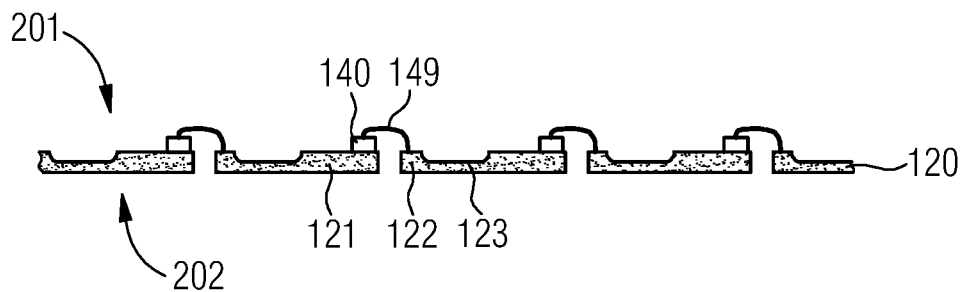
FIGS. 29 to 31 show a further method sequence of producing a chip module including a lens structure on the basis of lateral illustrations, wherein a leadframe is used as a carrier.

In the method, a metallic leadframe 120 is provided, and subsequently radiation-emitting semiconductor chips 140 are arranged on the leadframe 120, as illustrated in FIG. 29. The leadframe 120 comprises the above-described structure, that is to say leadframe sections 121, 122 and web-type connection structures 123. The leadframe sections 121, 122 are arranged in groups of two leadframe section 121, 122 provided to mount and establish electrical connections with one semiconductor chip 140. Viewed from above, the leadframe 120 may have an appearance as shown in FIG. 6. As indicated in FIG. 29, the semiconductor chips 140 are mounted on the front side 201 of the leadframe sections 121 and electrically connect to the adjacent leadframe sections 122 by bond wires 149.

Figure 30:
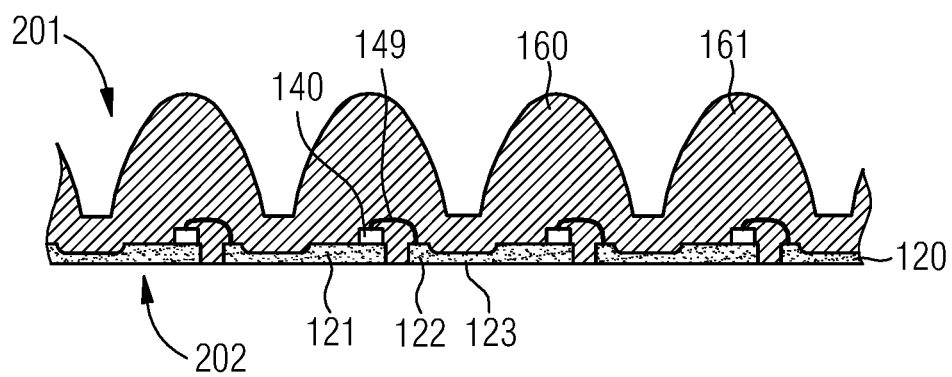

Afterwards, an electrically insulating material 160 is applied on the leadframe 120 in the form of a lens structure, thereby encapsulating the semiconductor chips 140, as illustrated in FIG. 30. For this purpose, a molding process may be carried out (not illustrated). The electrically insulating material 160 is applied such that the leadframe 120 is covered by the electrically insulating material 160 at the front side 201, and that the electrically insulating material 160 is present laterally to and between the leadframe sections 121, 122 and the connection structures 123. In contrast thereto, the back side 202 of the leadframe 120 remains free from the electrically insulating material 160. The lens structure comprises a plurality of lenses 161 arranged next to one another. Each lens 161 is assigned to one of the semiconductor chips 140.

Figure 31:
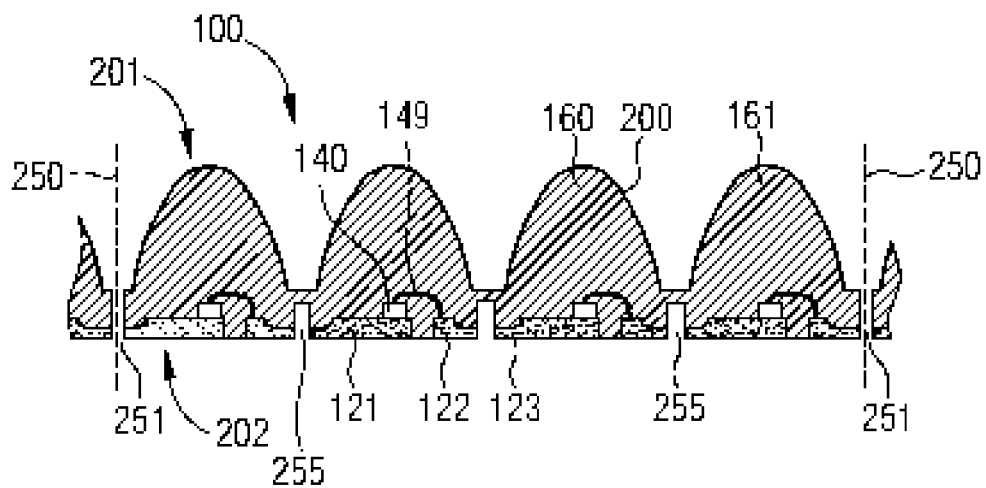

Subsequently, a structuring process is carried out as shown in FIG. 31. In this step, the leadframe 120 and the electrically insulating material 160 are fully severed at separating lines 250 to provide singulated chip modules 100. Moreover, trenches 255 are formed at the back side 202 such that the chip modules 100 comprise separate leadframe sections 121, 122 and separate chip components 200 connected and held together by the electrically insulating material 160.

In this respect, the connection structures 123 of the metallic leadframe 120 are severed such that the groups of leadframe sections 121, 122 that are each associated with one of the semiconductor chips 140 are no longer short-circuited but instead are electrically isolated from each other. In a similar way, the chip components 200 of the chip modules 100 produced by the structuring are electrically isolated from each other.

The chip components 200 of the chip modules 100 depicted in FIG. 31 each comprise two leadframe sections 121, 122, a radiation-emitting semiconductor chip 140 arranged on the leadframe section 121 and a lens 161. Each chip component 200 and thus the corresponding semiconductor chip 140 may be independently powered by the corresponding leadframe sections 121, 122.

Another variant of a production method consists in producing radiation-emitting chip modules 100 that may be applied as display modules for a video wall. In this regard, arranging semiconductor chips close to each other on a carrier as described above makes it possible to provide a high resolution display within a small area. Such chip modules 100 may also be referred to as tiles or, respectively, LED tiles, and may be realized with semiconductor chips configured to generate light radiations having different colors. In this regard, it is again possible to apply a leadframe-based carrier comprising molded bodies with a cavity, and to carry out a method sequence similar to the method sequence described above with reference to FIGS. 1 to 12.

Figure 36:
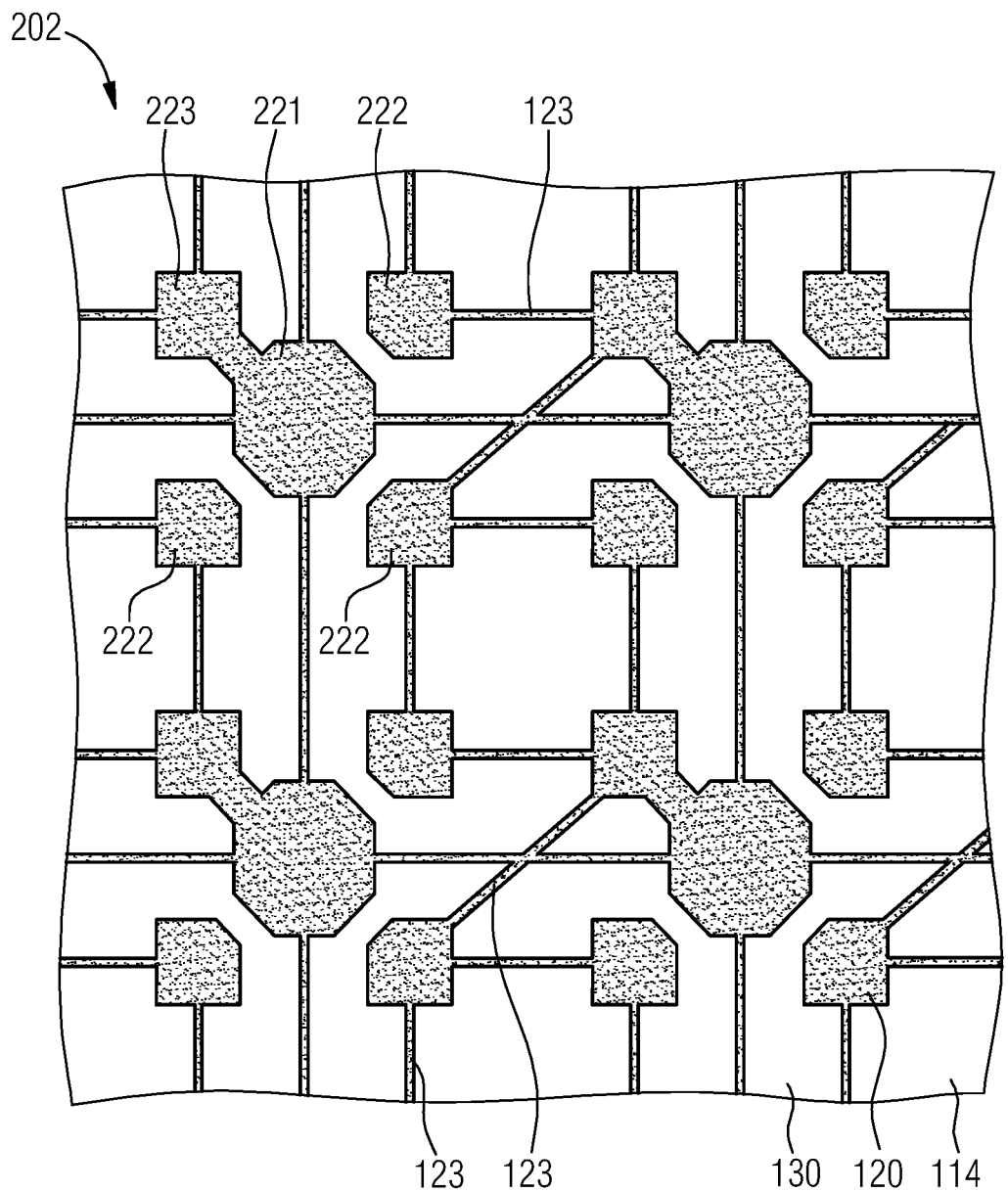
FIGS. 36 and 37 show corresponding bottom views of conditions present in the method of FIGS. 32 to 35.
Figure 37:
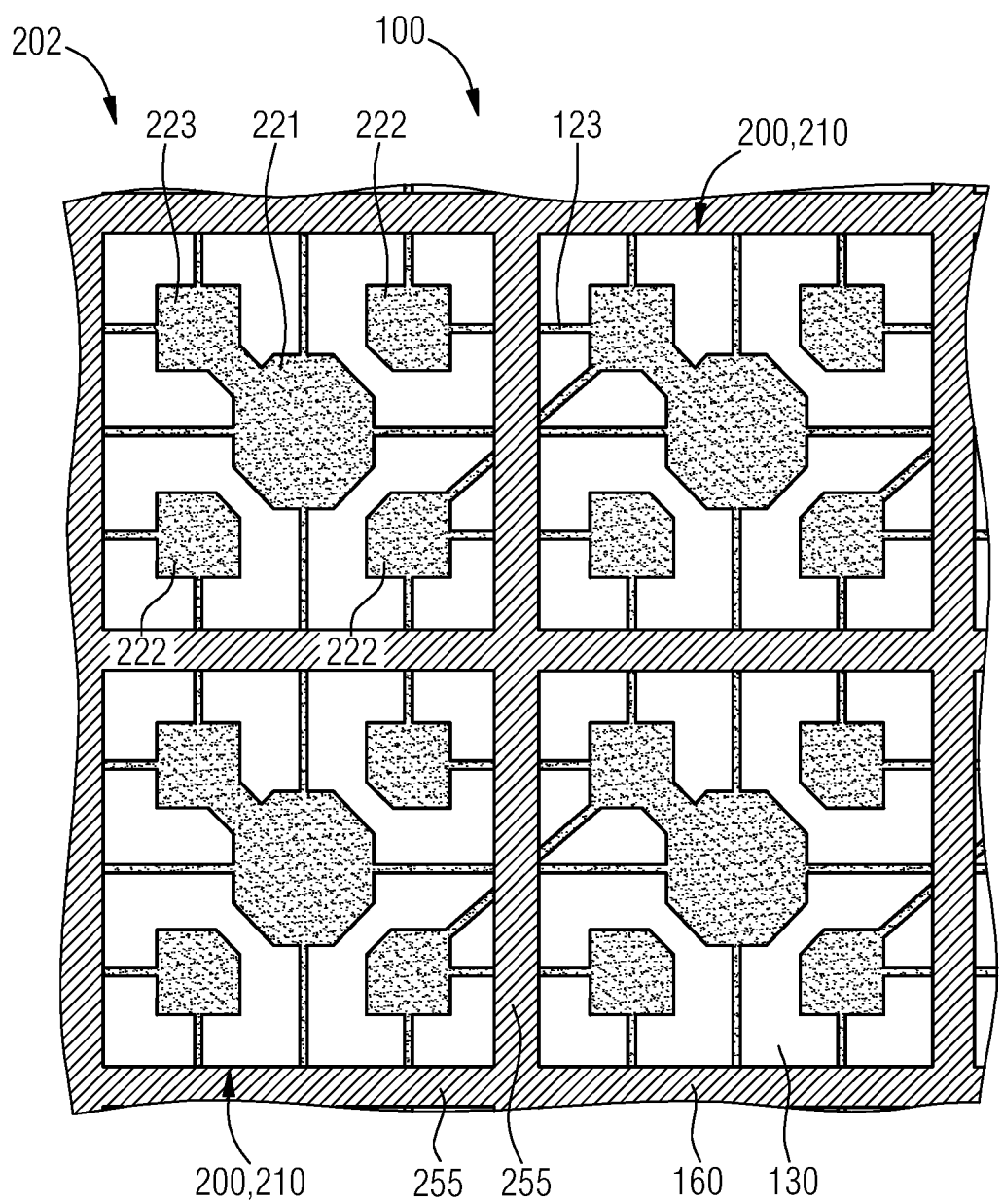

By way of illustration, a possible variant of such a production method is described in the following with reference to FIGS. 32 to 37. In this regard, FIGS. 32 to 35 illustrate the method as an excerpt viewed from above, and FIGS. 36 and 37 illustrate respective conditions as an excerpt viewed from below.

Figure 32:
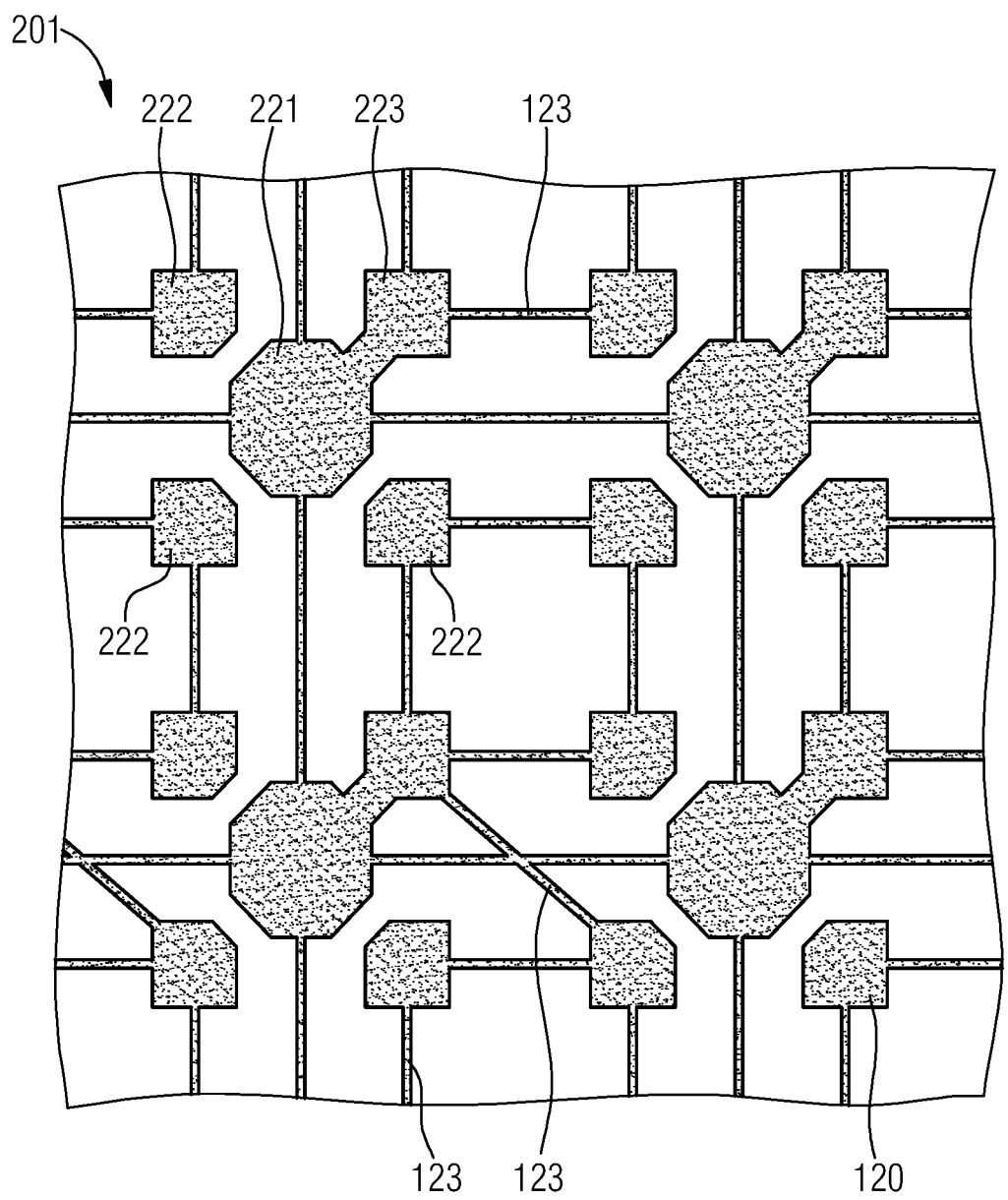
FIGS. 32 to 35 show a further method sequence of producing a chip module on the basis of top views, wherein a leadframe-based carrier including molded bodies with a cavity is used and semiconductor chips configured for generating different light radiations are arranged on the carrier in the cavities of the molded bodies.

Similar to the above-described method, a metallic leadframe 120 is provided as shown in FIG. 32 in a top view. This may comprise structuring or, respectively, etching an initial metallic layer (not illustrated). In contrast to the leadframe 120 depicted in FIG. 6, the leadframe 120 illustrated in FIG. 32 has a more complex structure and comprises groups of leadframe sections 221, 222, 223 being connected by web-type and half-etched connection structures 123. Each group comprises a central leadframe section 221, three leadframe sections 222 arranged laterally to the leadframe section 221, and one leadframe section 223 directly connected to the leadframe section 221. The leadframe sections 222, 223 are arranged around the central leadframe section 221 in a rectangular fashion. The connection of the central leadframe section 221 and the leadframe section 223 is realized by a connection structure having a greater width compared to the connection structures 123, and having the same thickness as the leadframe sections 221, 222, 223. Each of these groups of leadframe sections 221, 222, 223 is provided to mount and establish electrical connections with three semiconductor chip 141, 142, 143 applied in a later stage of the method (see FIG. 34).

Figure 33:
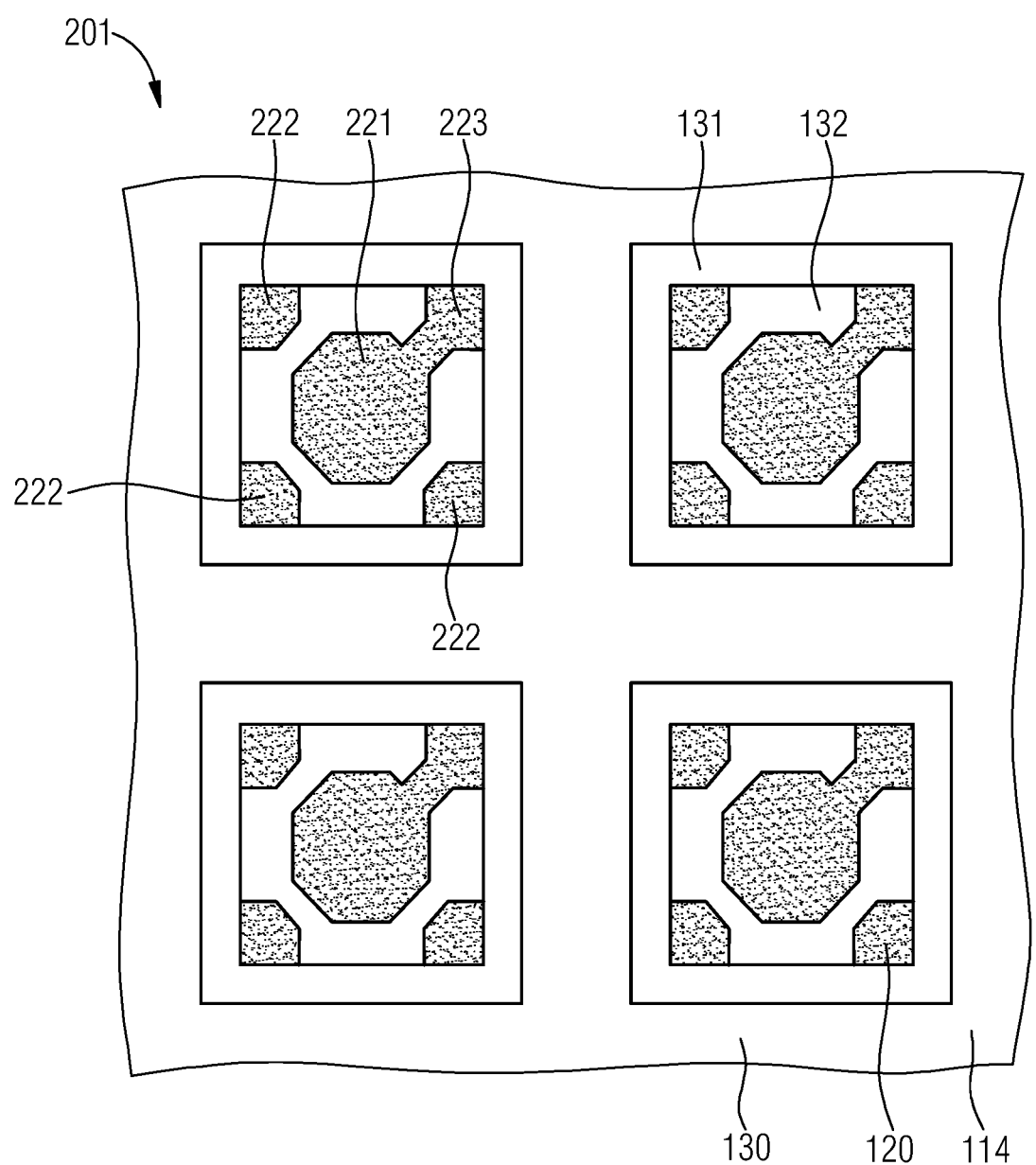

Subsequently, a molding process is carried out in which a molding compound 130 is molded around the leadframe 120 (not illustrated). In this way, a leadframe-based carrier 114 is provided as shown in FIG. 33 in a top view and in FIG. 36 in a bottom view. The molding process is carried out such that the leadframe-based carrier 114 comprises connected molded bodies 131 formed from the molding compound 130, each molded body 131 enclosing a cavity 132 (see FIG. 33). The molded bodies 131 comprise a rectangular frame-type shape. Each molded body 131 is formed in the area of one of the above-mentioned groups of leadframe sections 221, 222, 223 such that the respective leadframe sections 221, 222, 223 or, respectively, a part of the same is exposed at the front side 201 of the carrier 114 by the cavity 132 of the corresponding molded body 131. Similar to above-described method, the cavities 132 of the molded bodies 131 may comprise a widening cross-sectional shape in a direction away from the leadframe 120 such that the molded bodies 131 may act as reflectors (not illustrated). The connection structures 123 are covered by the molding compound 130 at the front side 201 of the carrier 114. In contrast to the front side 201 shown in FIG. 33, the whole leadframe 120 of the carrier 114 is visible at the back side 202, as illustrated in FIG. 36.

Figure 34:
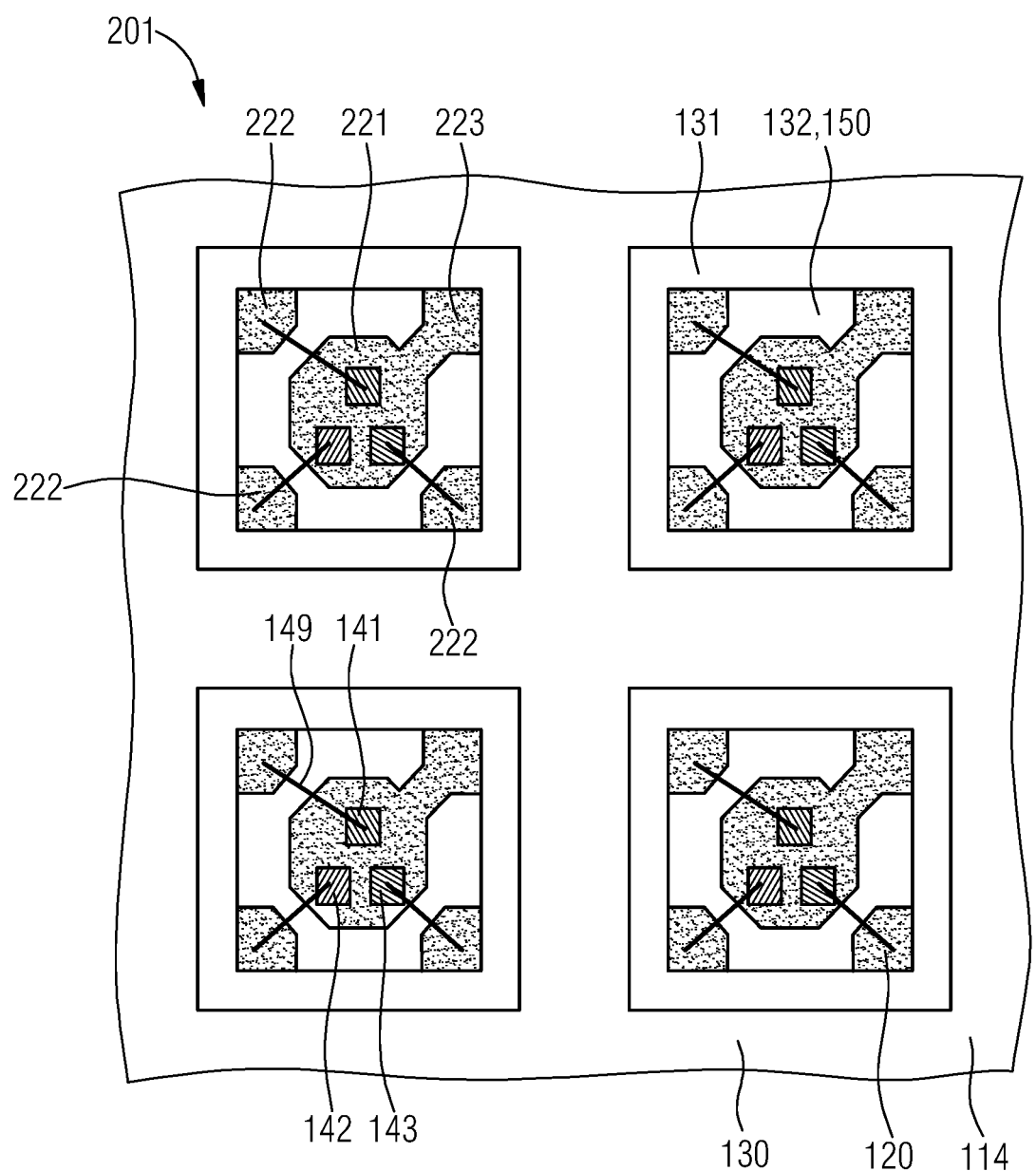

Subsequently, radiation-emitting semiconductor chips 141, 142, 143 are arranged on the front side 201 of the carrier 114 in the cavities 132 of the molded bodies 131 and electrically connect to the leadframe 120 as illustrated in FIG. 34 in a top view. The semiconductor chips 141, 142, 143 may, for example, be LED chips. FIG. 34 indicates a configuration of the semiconductor chips 141, 142, 143 having a front side contact and a back side contact. In each cavity 132, a group of three semiconductor chip 141, 142, 143, that is to say a first semiconductor chip 141 configured to generate a red light radiation, a second semiconductor chip 142 configured to generate a green light radiation and a third semiconductor chip 143 configured to generate a blue light radiation are arranged. In this respect, all three semiconductor chips 141, 142, 143 are mounted on the central leadframe section 221, for example, by carrying out processes such as soldering or gluing, and each of the semiconductor chips 141, 142, 143 furthermore electrically connect to one of the adjacent leadframe sections 222 by bond wires 149. Afterwards, the cavities 132 are furthermore filled with a clear and light-transmissive encapsulation material 150.

Figure 35:
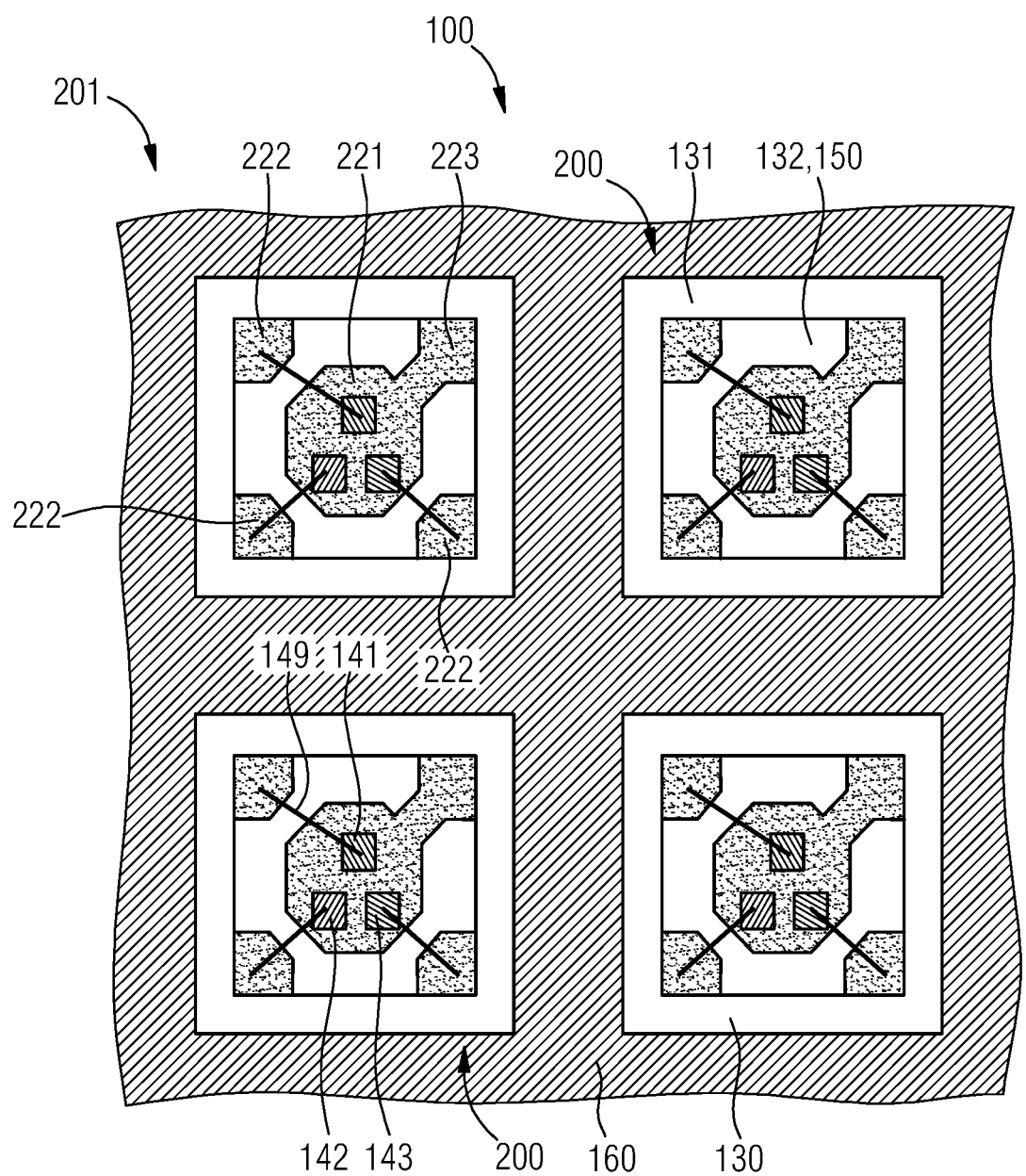

Subsequently, an electrically insulating material 160 is applied on the front side 201 of the carrier 114 in areas laterally to and between the molded bodies 131 as shown in FIG. 35 in a top view. As described above, the electrically insulating material 160 may be a flexible material such that the chip modules 100 produced by the method may comprise a flexible construction.

Figure 38:
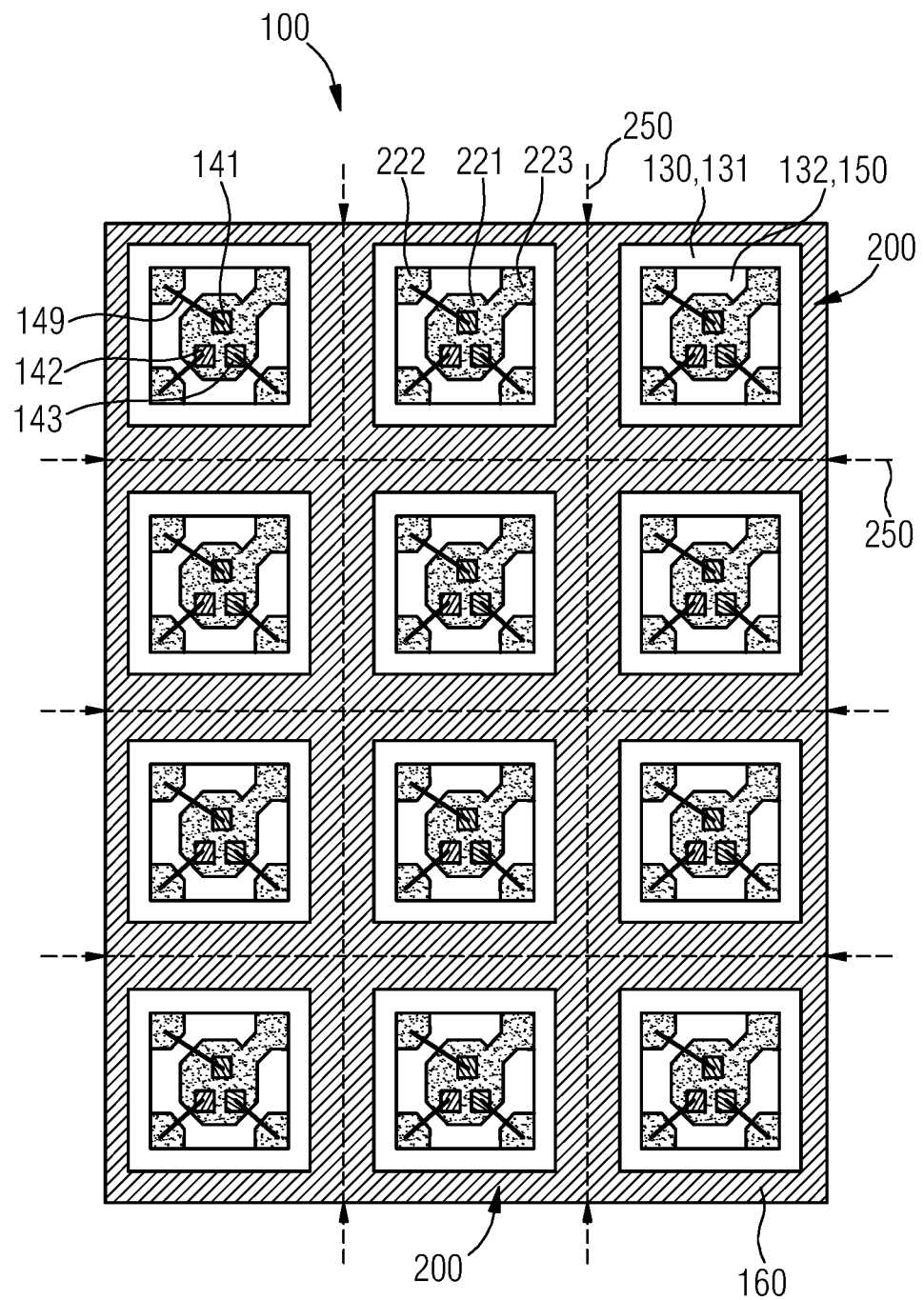
FIG. 38 shows a top view of a chip module, wherein separating lines for separating the chip module are additionally illustrated.

After this, a structuring step is carried out. In this step, the leadframe-based carrier 114 and the electrically insulating material 160 are fully severed in areas laterally to and between the molded bodies 131 at respective separating lines such that singulated chip modules 100 are provided (not illustrated). Each chip module 100 produced in this way may have a configuration as illustrated in FIG. 38 in a top view.

The structuring step furthermore comprises severing the carrier 114 and part of the electrically insulating material 160 in areas laterally to and between the molded bodies 131 starting from the back side 202 such that back-side trenches 255 running perpendicularly to each other are formed, as illustrated in FIG. 37 in a bottom view. The trenches 255 are produced in the form of a continuous rectangular grid structure and extend to the electrically insulating material 160 such that the electrically insulating material 160 is also visible at the back side 202. In this way, the chip modules 100 produced by the structuring comprise separate carrier sections 210 and therefore individual chip components 200 connected and held together by the electrically insulating material 160. In this regard, the connection structures 123 of the metallic leadframe 120 are severed such that the groups of leadframe sections 221, 222, 223 which are each associated with a group of three semiconductor chips 141, 142, 143 are electrically isolated from each other. In a similar way, the carrier sections 210 and chip components 200 of the chip modules 100 produced are electrically isolated from each other.

The carrier sections 210 of the chip modules 100 each comprise a central leadframe section 221, three leadframe sections 222, a leadframe section 223, and the molding compound 130 connected to the same. Each carrier section 210 furthermore comprises a respective molded body 131 formed from the molding compound 130 and enclosing a cavity 132.

The chip components 200 of the chip modules 100 each comprise a respective carrier section 210 and three radiation-emitting semiconductor chip 141, 142, 143 arranged on the carrier section 210 within the cavity 132 of the respective molded body 131. The semiconductor chips 141, 142, 143 are furthermore encapsulated by the encapsulation material 150. With regard to each chip component 200, the corresponding semiconductor chips 141, 142, 143 may be independently powered by the leadframe section 223 connected to the central leadframe section 221 and by a respective one of the other three leadframe sections 222. A light radiation produced during operation of the semiconductor chips 141, 142, 143 may be emitted from the encapsulation material 150 of the chip components 200 (not illustrated). Due to the usage of semiconductor chips 141, 142, 143 for emitting a red, green and blue light radiation (RGB), the chip components 200 and the chip modules 100 may also be referred to as RGB components 200 and RGB modules 100.

Figure 39:
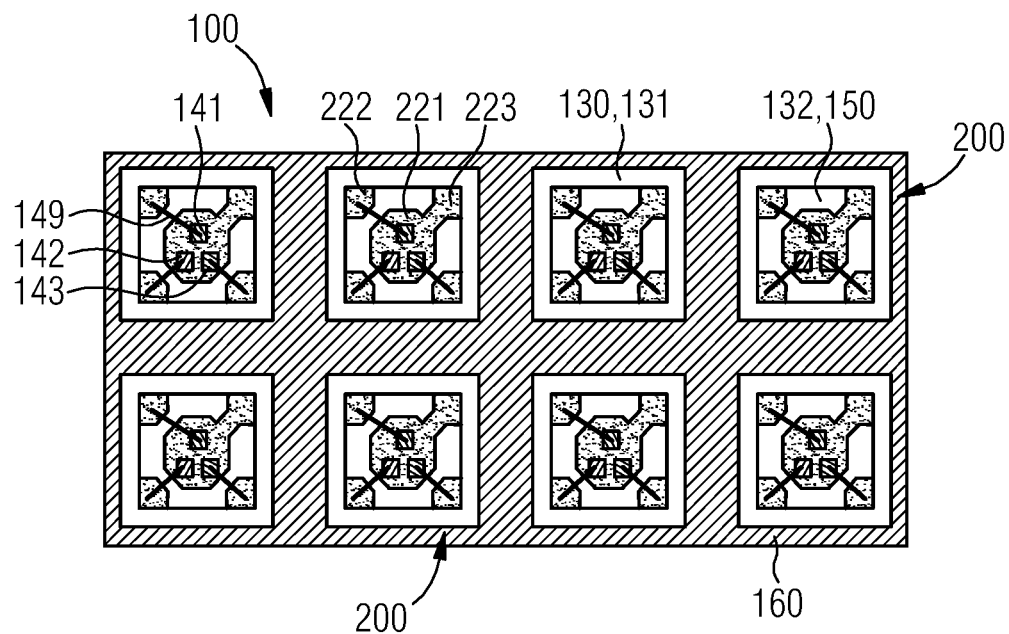
FIGS. 39 to 41 show top views of further chip modules with different sizes.
Figure 40:
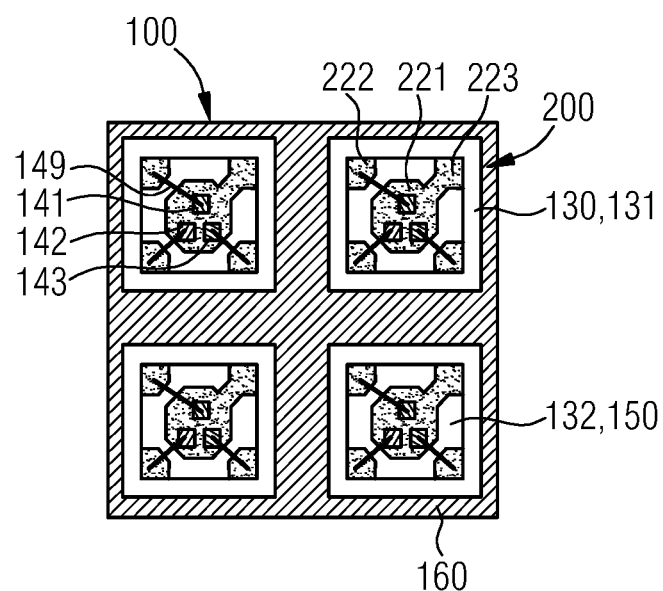
Figure 41:
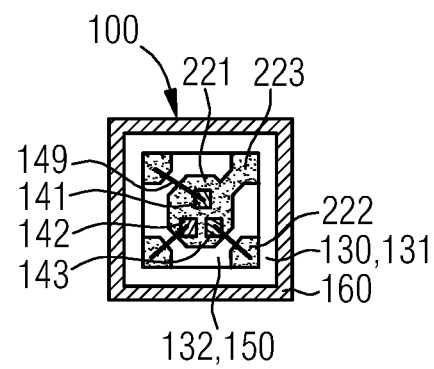

FIG. 38 depicts a top view of a chip module 100 that may be produced by the above-described method. The chip module 100 comprises a rectangular outline and a 3×4 matrix of chip components 200 connected by the electrically insulating material 160. Apart from the depicted configuration, chip modules 100 with other or, respectively, bigger matrix sizes may be fabricated by carrying out the method (not illustrated). Moreover, it is again possible to further singulate such chip modules 100 by only severing the electrically insulating material 160 at respective separating lines 250 between the chip components 200. In this way, for example, chip modules 100 with a 4×2 matrix as shown in FIG. 39, chip modules 100 with a 2×2 matrix as shown in FIG. 40 or chip modules 100 in the form of a single unit comprising three semiconductor chips 141, 142, 143 as shown in FIG. 41 may be produced.

The examples explained with reference to the figures constitute preferred or examples. Besides the examples described and depicted, further examples are possible which may comprise further modifications and/or combinations of features. It is, for example, possible to apply other materials instead of the materials indicated above.

Further modifications may, for example, be considered with regard to carriers or, respectively, leadframes used in the production of chip modules. Such components may be realized with structures and configurations different from the structures and configurations illustrated in the figures and described above. In this regard, it is also possible, for example, to provide molded bodies with a rounded frame-type shape instead of the depicted rectangular frame-type shape.

Attention is furthermore drawn to the possibility of producing RGB chip modules with a lens structure. In this regard, method sequences similar to the method sequences described above with reference to FIGS. 18 to 31 may be carried out, wherein semiconductor chips configured to emit different light radiations, that is to a red, a green and a blue light radiation, may be applied.

Although my chip modules and methods have been more specifically illustrated and described in detail by preferred examples, nevertheless this disclosure is not restricted by the examples disclosed and other variations may be derived therefrom by those skilled in the art, without departing from the scope of protection of the appended claims.

The invention claimed is:

1. A method of producing a chip module comprising:
providing a carrier;
arranging semiconductor chips on the carrier;
applying an electrically insulating material on the carrier; and
structuring the carrier such that the chip module is provided,
wherein the chip module comprises separate carrier sections produced by structuring the carrier, the carrier sections of the chip module connected by the electrically insulating material, structuring the carrier comprises forming trenches,
forming the trenches is carried out such that the trenches are present at a back side of the provided chip module and the trenches extend to the electrically insulating material such that the electrically insulating material is visible at the back side of the provided chip module via the trenches,
applying the electrically insulating material on the carrier is carried out after arranging the semiconductor chips on the carrier,
structuring the carrier including forming the trenches is carried out after applying the electrically insulating material on the carrier, and
forming the trenches comprises severing the carrier only in areas of the trenches to be formed.

2. The method according to claim 1, wherein the method further comprises at least one of:
1) the semiconductor chips are radiation-emitting semiconductor chips,
2) the electrically insulating material is applied on the carrier in the form of a structure comprising a plurality of lens,
3) the semiconductor chips comprise some semiconductor chips configured to generate a first light radiation, other semiconductor chips configured to generate a second light radiation and still other semiconductor chips configured to generate a third light radiation, and
4) the electrically insulating material is a flexible material.

3. The method according to claim 1, wherein the provided carrier comprises an electrically insulating carrier material and electrical conductor structures.

4. The method according to claim 1, wherein the provided carrier comprises a metallic leadframe and a molding compound connected to the metallic leadframe,
the metallic leadframe comprises metallic leadframe sections and metallic connection structures connecting the metallic leadframe sections,
structuring the carrier comprises severing metallic connection structures of the metallic leadframe, and
metallic connection structures of the metallic leadframe are severed by forming the trenches.

5. The method according to claim 4,
wherein the carrier comprises molded bodies formed from the molding compound, each molded body enclosing a cavity,
the semiconductor chips are arranged on the metallic leadframe in the cavities of the molded bodies, and
the electrically insulating material is applied on the carrier in areas laterally to and between the molded bodies.

6. The method according to claim 1, wherein the provided carrier is one of:
a printed circuit board;
a ceramic carrier comprising electrical conductor structures; or
a metallic leadframe.

7. The method according to claim 1, wherein the provided chip module is singulated into smaller chip modules by only severing the electrically insulating material.

8. The method according to claim 1, wherein structuring the carrier additionally comprises removing a part of the electrically insulating material.

9. The method according to claim 1, wherein applying the electrically insulating material on the carrier is carried out by filling, potting or molding.

10. A method of producing a chip module comprising:
providing a carrier;
arranging semiconductor chips on the carrier;
applying an electrically insulating material on the carrier; and
structuring the carrier such that the chip module is provided,
wherein the chip module comprises separate carrier sections produced by structuring the carrier, the carrier sections of the chip module connected by the electrically insulating material,
the provided carrier comprises a metallic leadframe, a molding compound connected to the metallic leadframe and molded bodies formed from the molding compound and connected to each other by the molding compound, each molded body enclosing a cavity,
the semiconductor chips are arranged on the metallic leadframe in the cavities of the molded bodies, and
the electrically insulating material is applied on the carrier in areas laterally to and between the molded bodies.

11. The method according to claim 1, wherein the trenches are formed as a continuous grid structure.

12. The method according to claim 10, wherein a group of three radiation-emitting semiconductor chips is arranged in each cavity of the molded bodies, the group comprising a first semiconductor chip configured to generate a red light radiation, a second semiconductor chip configured to generate a green light radiation and a third semiconductor chip configured to generate a blue light radiation.

13. The method according to claim 1, wherein structuring the carrier is carried out by a mechanical process, the mechanical process being one of sawing, cutting or laser cutting.

14. A method of producing a chip module comprising:
providing a carrier;
arranging semiconductor chips on the carrier;
applying an electrically insulating material on the carrier; and
structuring the carrier such that the chip module is provided,
wherein the chip module comprises separate carrier sections produced by structuring the carrier, the carrier sections of the chip module connected by the electrically insulating material,
structuring the carrier comprises forming trenches,
forming the trenches is carried out such that the trenches are present at a back side of the provided chip module and the trenches extend to the electrically insulating material such that the electrically insulating material is visible at the back side of the provided chip module via the trenches, and the method further comprises at least one of:
1) structuring the carrier additionally comprises removing a part of the electrically insulating material, and
2) the provided carrier comprises a metallic leadframe and a molding compound connected to the metallic leadframe, the metallic leadframe comprises metallic leadframe sections and metallic connection structures connecting the metallic leadframe sections, structuring the carrier comprises severing metallic connection structures of the metallic leadframe, and metallic connection structures of the metallic leadframe are severed by forming the trenches.

* * * * *